(12) United States Patent
Bang et al.

(10) Patent No.: US 11,527,295 B2
(45) Date of Patent: Dec. 13, 2022

(54) NONVOLATILE MEMORY DEVICE WITH PAGE BUFFER CIRCUIT SUPPORTING READ OPERATION OF IMPROVED RELIABILTY

(71) Applicant: Samsung Electronics Co., Ltd., Suwon-si (KR)

(72) Inventors: Jinbae Bang, Anyang-si (KR); Doohyun Kim, Hwaseong-si (KR); Minseok Kim, Hwaseong-si (KR); Jisu Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/200,557

(22) Filed: Mar. 12, 2021

(65) Prior Publication Data
US 2022/0051714 A1    Feb. 17, 2022

(30) Foreign Application Priority Data

Aug. 11, 2020   (KR) .................. 10-2020-0100381

(51) Int. Cl.
| | | |
|---|---|---|
| G11C 11/408 | (2006.01) | |
| G11C 16/34 | (2006.01) | |
| G11C 16/26 | (2006.01) | |
| G11C 16/24 | (2006.01) | |
| G11C 7/10 | (2006.01) | |
| G11C 16/04 | (2006.01) | |

(52) U.S. Cl.
CPC .......... *G11C 16/3427* (2013.01); *G11C 7/106* (2013.01); *G11C 16/24* (2013.01); *G11C 16/26* (2013.01); *G11C 16/3418* (2013.01); *G11C 16/0483* (2013.01); *G11C 2211/5642* (2013.01)

(58) Field of Classification Search
CPC .. G11C 16/0483; G11C 16/3418; G11C 16/26
See application file for complete search history.

(56) References Cited

U.S. PATENT DOCUMENTS

| | | | |
|---|---|---|---|
| 8,130,544 B2 | 3/2012 | Chou et al. | |
| 8,248,858 B2 | 8/2012 | Kang | |
| 8,270,227 B2 | 9/2012 | Park et al. | |
| 8,462,555 B2 | 6/2013 | Park | |
| 8,467,248 B2 | 6/2013 | Aritome | |
| 8,665,643 B2 | 3/2014 | Kim et al. | |
| 8,717,822 B2 | 5/2014 | Lee et al. | |
| 2010/0074026 A1* | 3/2010 | Kang | G11C 11/5642 365/185.25 |

(Continued)

FOREIGN PATENT DOCUMENTS

| | | |
|---|---|---|
| KR | 101774471 B1 | 9/2017 |
| KR | 1020180032788 A | 4/2018 |

*Primary Examiner* — Mushfique Siddique
(74) *Attorney, Agent, or Firm* — Muir Patent Law, PLLC

(57) ABSTRACT

Disclosed are a nonvolatile memory device and a read method of the nonvolatile memory device. The nonvolatile memory device includes a memory cell array, a row decoder circuit, and a page buffer circuit including first latches and second latches. The page buffer circuit respectively latches first sensing values, which are based on data stored in adjacent memory cells, at the first latches and respectively latches second sensing values, which are based on data stored in selected memory cells, at the second latches at least two times.

12 Claims, 19 Drawing Sheets

(56) References Cited

U.S. PATENT DOCUMENTS

| | | | |
|---|---|---|---|
| 2013/0083607 A1* | 4/2013 | Joo | G11C 16/08 |
| | | | 365/185.21 |
| 2018/0090216 A1* | 3/2018 | Hahn | G11C 11/5671 |
| 2018/0204624 A1* | 7/2018 | Yoon | G11C 29/028 |
| 2020/0395090 A1* | 12/2020 | Kang | G11C 16/3481 |
| 2021/0005265 A1* | 1/2021 | Lee | G11C 16/08 |
| 2021/0005271 A1* | 1/2021 | Shin | G11C 16/08 |

* cited by examiner

NONVOLATILE MEMORY DEVICE WITH PAGE BUFFER CIRCUIT SUPPORTING READ OPERATION OF IMPROVED RELIABILTY

CROSS-REFERENCE TO RELATED APPLICATIONS

This application claims priority under 35 U.S.C. § 119 to Korean Patent Application No. 10-2020-0100381 filed on Aug. 11, 2020, in the Korean Intellectual Property Office, the disclosure of which is incorporated by reference herein in its entirety.

BACKGROUND

Embodiments of the present disclosure disclosed here relate to a semiconductor device, and more particularly, relate to a nonvolatile memory device supporting a read operation of improved reliability and having the smaller area and a read method of the nonvolatile memory device.

Nonvolatile memory devices may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or the like.

A nonvolatile memory device is configured to store data in memory cells. When an operation of storing data in memory cells connected to one word line is performed, the operation may influence memory cells in which data are previously stored. Accordingly, technologies for reading memory cells of the nonvolatile memory device based on data stored in adjacent memory cells are being proposed to improve the accuracy.

SUMMARY

Embodiments of the present disclosure provide a nonvolatile memory device reading data stored in memory cells of the nonvolatile memory device with improved accuracy and having the smaller area and a read method of the nonvolatile memory device.

According to some embodiments, a nonvolatile memory device may include a memory cell array that includes memory cells arranged in rows and columns, a row decoder circuit that is connected to the rows of the memory cells through word lines, the row decoder circuit selects a first word line of the word lines connected to adjacent memory cells adjacent to selected memory cells and a second word line of the word lines connected to the selected memory cells, and a page buffer circuit that is connected to the columns of the memory cells through bit lines and including first latches and second latches. The page buffer circuit may respectively latch first sensing values, which are based on data stored in the adjacent memory cells, at the first latches and may respectively latch second sensing values, which are based on data stored in the selected memory cells, at the second latches at least two times.

According to some embodiments, a read method of a nonvolatile memory device may include performing preceding sensing on first memory cells connected to a first word line from among a plurality of memory cells, storing first sensing values as a result of the preceding sensing in first latches, respectively, performing first sensing on second memory cells connected to a second word line from among the plurality of memory cells, and performing second sensing on the second memory cells. The performing of the first sensing may include latching first sensing values as a result of the first sensing at second latches. The performing of the second sensing may include again latching second sensing values as a result of the second sensing at the second latches.

According to some embodiments, a nonvolatile memory device may include a memory cell region that includes a first metal pad and a memory cell array, and a peripheral circuit region that includes a second metal pad and is vertically connected to the memory cell region by the first metal pad and the second metal pad. The memory cell array may include a plurality of cell strings each including a plurality of memory cells, a plurality of word lines connected to the plurality of memory cells, a plurality of bit lines connected to the plurality of cell strings, and a ground selection line connected to the plurality of cell strings. The peripheral circuit region may include a row decoder circuit that selects a first word line connected to adjacent memory cells adjacent to selected memory cells of the plurality of memory cells and a second word line connected to the selected memory cells from the word lines, and a page buffer circuit connected to the bit lines and including first latches and second latches. The page buffer circuit may respectively latch first sensing values, which are based on data stored in the adjacent memory cells, at the first latches and may respectively latch second sensing values, which are based on data stored in the selected memory cells, at the second latches at least two times.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the present disclosure.

Hereinafter, embodiment of the present disclosure will be described in detail with reference to accompanying drawings. With regard to the description of the present disclosure, to make the overall understanding easy, similar components will be marked by similar reference signs/numerals in drawings, and thus, additional description will be omitted to avoid redundancy.

Figure 1:
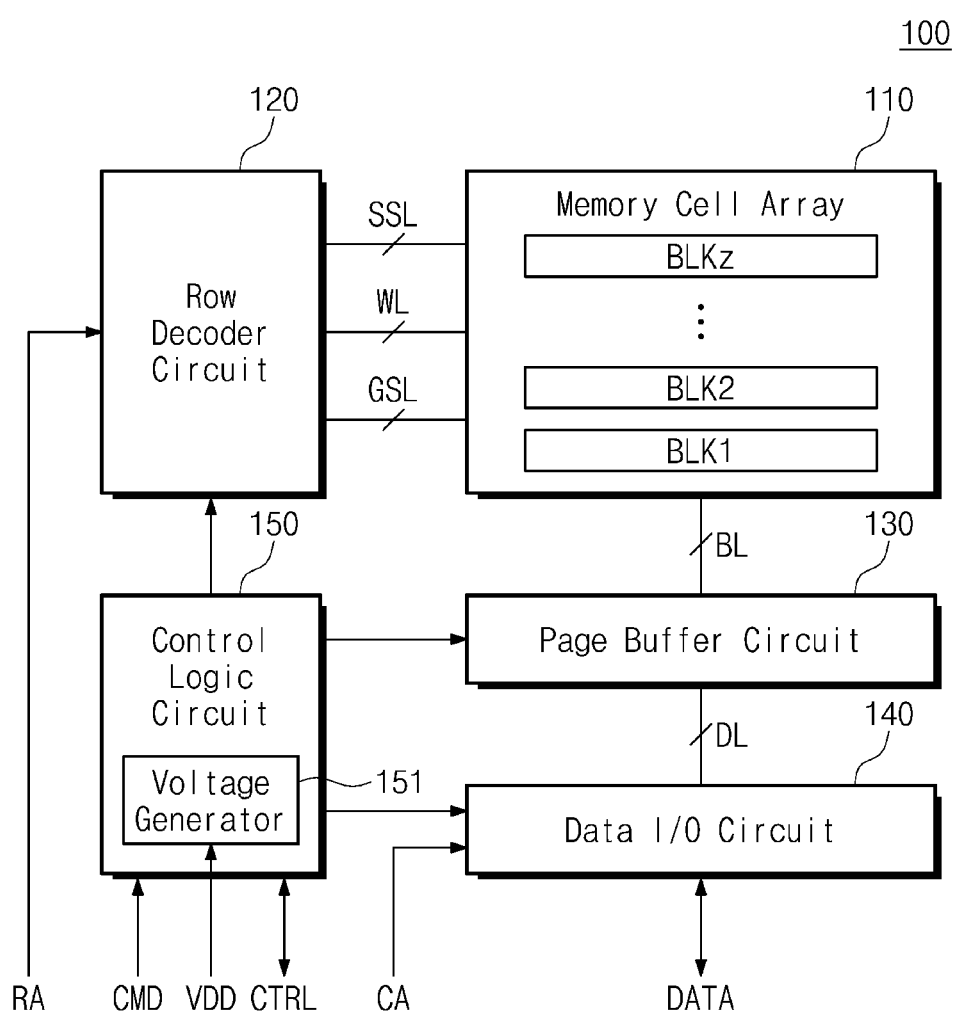
FIG. 1 illustrates a block diagram of a nonvolatile memory device according to an embodiment of the present disclosure.

FIG. 1 illustrates a block diagram of a nonvolatile memory device according to an embodiment of the present disclosure. Referring to FIG. 1, a nonvolatile memory device 100 may include a memory cell array 110, a row decoder circuit 120, a page buffer circuit 130, a data input/output circuit 140, and a control logic circuit 150.

The memory cell array 110 may include a plurality of memory blocks BLK1 to BLKz (z being a natural number). Each of the plurality of memory blocks BLK1 to BLKz may include a plurality of memory cells. Each of the memory blocks BLK1 to BLKz may be connected to the row decoder circuit 120 through one or more ground selection lines GSL, word lines WL, and one or more string selection lines SSL. Each of the memory blocks BLK1 to BLKz may be connected to the page buffer circuit 130 through a plurality of bit lines BL. The memory blocks BLK1 to BLKz may be connected in common with the plurality of bit lines BL.

The row decoder circuit 120 may be connected to the memory cell array 110 through the string selection lines SSL, the word lines WL, and the ground selection lines GSL. The row decoder circuit 120 may operate under control of the control logic circuit 150.

The row decoder circuit 120 may receive a row address RA provided from an external device of the nonvolatile memory device 100 and may decode the received row address RA. The row decoder circuit 120 may select one of the word lines WL connected to the memory cell array 110 in response to the decoded row address. The row decoder circuit 120 may adjust voltages to be applied to the string selection lines SSL, the word lines WL, and the ground selection lines GSL based on the decoded row address.

The page buffer circuit 130 may be connected to the memory cell array 110 through the plurality of bit lines BL. The page buffer circuit 130 may be connected to the data input/output circuit 140 through a plurality of data lines DL. The page buffer circuit 130 may operate under control of the control logic circuit 150.

For example, when a program operation is performed, the page buffer circuit 130 may store data to be written in memory cells of the memory cell array 110. The page buffer circuit 130 may apply voltages to the plurality of bit lines BL based on the stored data. When a read operation is performed or a verification read operation of the program operation or an erase operation is performed, the page buffer circuit 130 may sense voltages of the bit lines BL and may store a result of the sensing.

The data input/output circuit 140 may be connected to the page buffer circuit 130 through the plurality of data lines DL. The data input/output circuit 140 may operate under control of the control logic circuit 150. The data input/output circuit 140 may receive a column address CA from the external device of the nonvolatile memory device 100. The data input/output circuit 140 may output data read by the page buffer circuit 130, based on the column address CA. The data input/output circuit 140 may transmit data received from the external device to the page buffer circuit 130 through the data lines DL, based on the column address CA.

Figure 17:
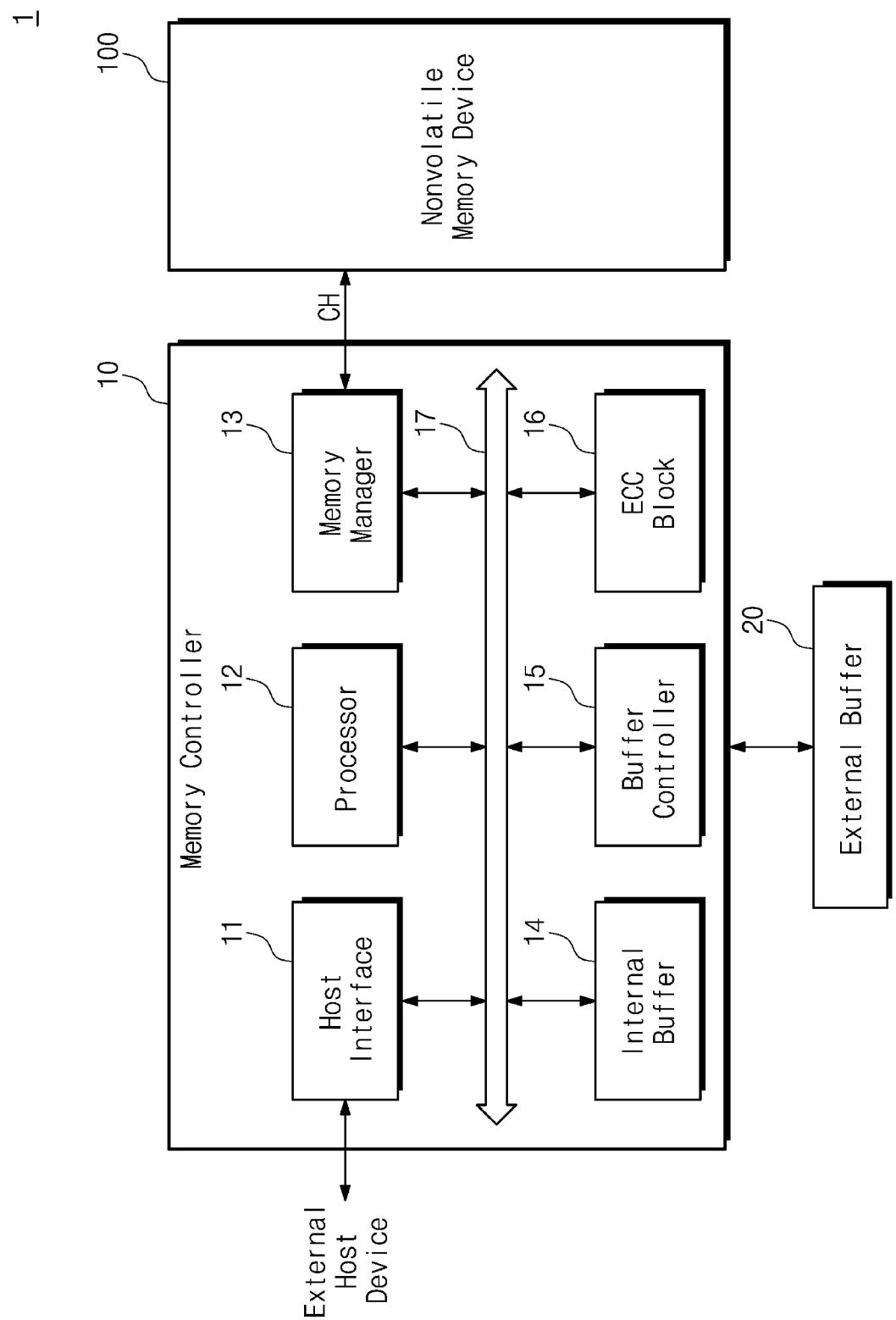
FIG. 17 illustrates a block diagram of a storage device including a nonvolatile memory device of FIG. 1.

The control logic circuit 150 may receive a command CMD from the external device (e.g., a memory controller 10 of FIG. 17). The control logic circuit 150 may exchange a control signal CTRL with the external device. The control logic circuit 150 may decode the received command CMD. The control logic circuit 150 may control the row decoder circuit 120, the page buffer circuit 130, and the data input/output circuit 140, based on the decoded command.

The control logic circuit 150 may include a voltage generator 151. The voltage generator 151 may receive a driving voltage VDD from the external device. The voltage generator 151 may generate various voltages necessary for the program operation, the erase operation, or the read operation of the nonvolatile memory device 100, based on the driving voltage VDD. The voltage generator 151 may provide the generated voltages to the components of the nonvolatile memory device 100.

Figure 2:
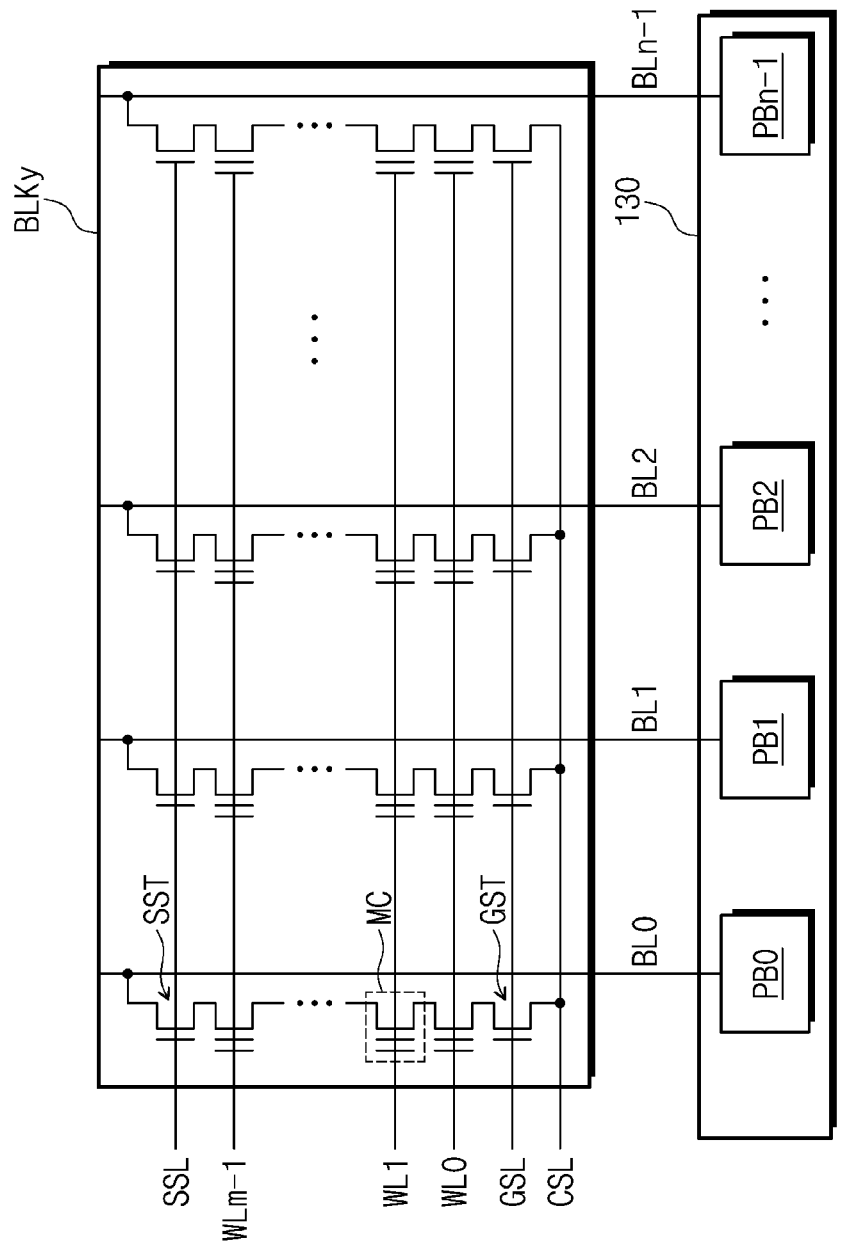
FIG. 2 illustrates a block diagram of a memory block and a page buffer circuit of FIG. 1 in detail.

FIG. 2 illustrates a block diagram of a memory block and a page buffer circuit of FIG. 1 in detail. FIG. 2 shows a memory block BLKy (y being a natural number of 1 or more and z or less) of the memory blocks BLK1 to BLKz and the page buffer circuit 130 of FIG. 1 by means of example. For brevity of drawing, the remaining memory blocks of the memory cell array 110 and the remaining components of the nonvolatile memory device 100 are omitted.

Referring to FIGS. 1 and 2, the memory block BLKy may include a plurality of cell strings respectively connected to a plurality of bit lines BL0 to BLn−1. Each of the plurality of cell strings may include a string selection transistor SST connected to the string selection line SSL, memory cells MC respectively connected to a plurality of word lines WL0 to WLm−1 (m being a natural number), and a ground selection transistor GST connected to the ground selection line GSL. Sources of the ground selection transistors GST respectively included in the plurality of cell strings may be connected to a common source line CSL.

The page buffer circuit 130 may include a plurality of page buffers PB0 to PBn−1 (n being a natural number) respectively connected to the plurality of bit lines BL0 to BLn−1. Each of the plurality of page buffers PB0 to PBn−1 may apply a voltage to the corresponding bit line (or a bit line connected thereto). The plurality of page buffers PB0 to PBn−1 may sense data stored in memory cells connected to the corresponding bit lines BL0 to BLn−1 and may store the sensed data.

Figure 3:
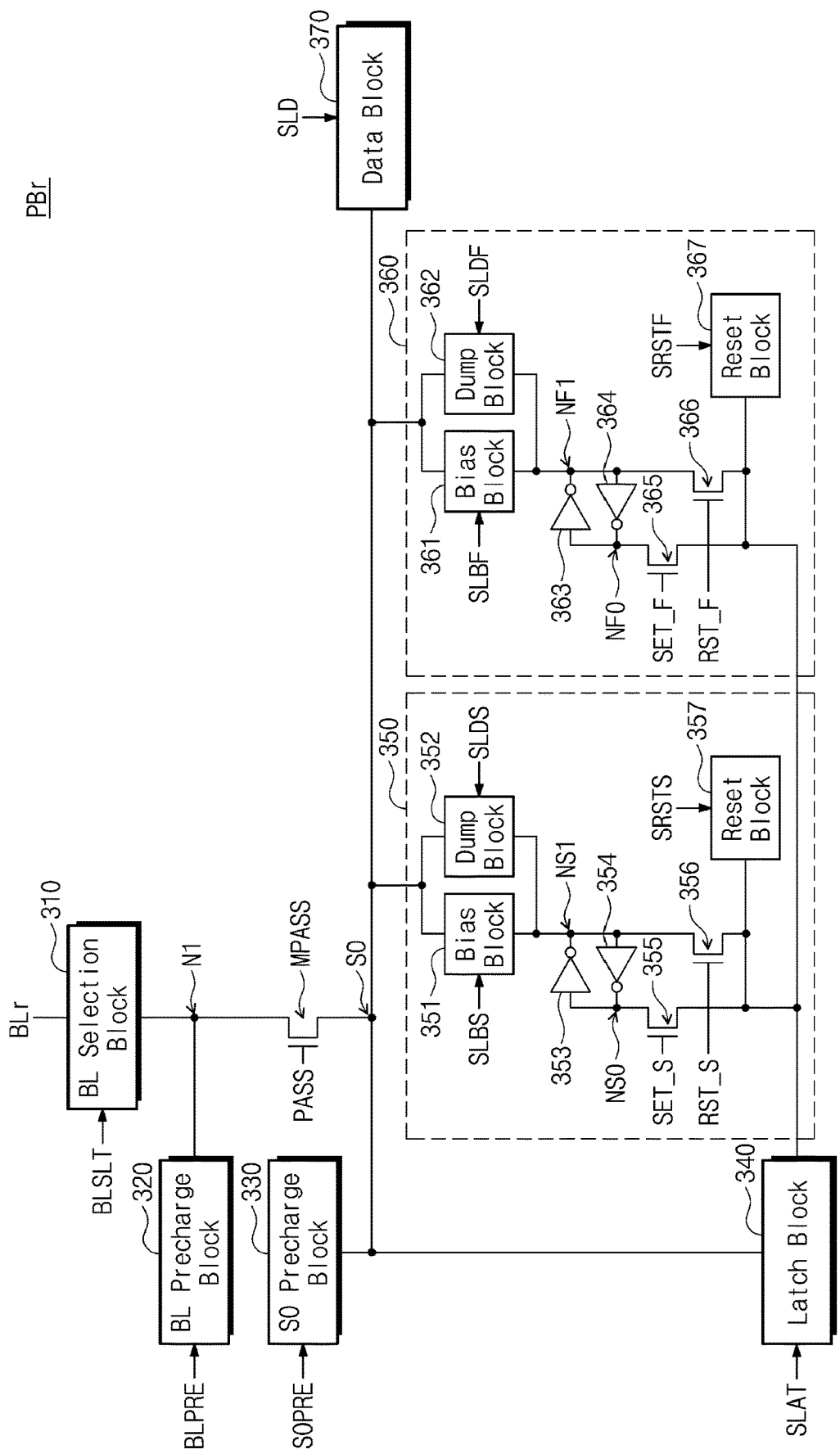
FIG. 3 illustrates a block diagram of a page buffer of FIG. 2 in detail according to example embodiments.

FIG. 3 illustrates a block diagram of a page buffer of FIG. 2 in detail according to example embodiments. For example, a block diagram of a page buffer PBr (r being a natural number smaller than n) of the plurality of page buffers PB0 to PBn−1 of the page buffer circuit 130 is illustrated in detail. Configurations and operations of the remaining page buffers may be identical or similar to the configuration and the operation of the page buffer PBr.

Referring to FIGS. 1 and 3, the page buffer PBr includes a bit line selection block 310, a bit line precharge block 320, a transistor MPASS, a sensing node precharge block 330, a latch block 340, a main sensing latch 350, an adjacent sensing latch 360, and a data block 370.

The bit line selection block 310 may be connected between a bit line BLr corresponding to the page buffer PBr and a node N1. The bit line selection block 310 may receive a bit line selection signal BLSLT from the control logic circuit 150. In response to the bit line selection signal BLSLT, the bit line selection block 310 may electrically connect the bit line BLr and the node N1 or may electrically disconnect the bit line BLr from the node N1.

The bit line precharge block 320 may be connected to the node N1. The bit line precharge block 320 may receive a bit line precharge signal BLPRE from the control logic circuit 150. The bit line precharge block 320 may apply a bit line precharge voltage (e.g., VPRCG of FIG. 8A) to the node N1 in response to the bit line precharge signal BLPRE. As such, the bit line BLr connected to the bit line selection block 310 may be charged with the bit line precharge voltage. The bit line precharge voltage may be supplied from the voltage generator 151.

The transistor MPASS may include a first end (e.g., a drain) connected to the node N1, a gate to which a signal PASS is applied, and a second end (e.g., a source) connected to a sensing node SO. The transistor MPASS may be turned on or turned off in response to the signal PASS applied from the control logic circuit 150. As the control logic circuit 150 generates the signal PASS and supplies the signal PASS to the transistor MPASS, the control logic circuit 150 may electrically connect the sensing nodes SO of the plurality of page buffers PB0 to PBn−1 with the corresponding bit lines BL0 to BLn−1 or may disconnect the sensing nodes SO of the plurality of page buffers PB0 to PBn−1 from the corresponding bit lines BL0 to BLn−1.

When the transistor MPASS is turned on, the bit line BLr may be electrically connected to the sensing node SO. As such, a voltage level of the sensing node SO may vary depending on a voltage level of the bit line BLr. When the transistor MPASS is turned off, the bit line BLr may be electrically disconnected from the sensing node SO. As such, a voltage level of the sensing node SO may not be influenced by a voltage level of the bit line BLr.

The sensing node precharge block 330 is connected to the sensing node SO. The sensing node precharge block 330 may receive a sensing node precharge signal SOPRE from the control logic circuit 150. The sensing node precharge block 330 may apply a sensing node precharge voltage to the sensing node SO in response to the sensing node precharge signal SOPRE. As such, the sensing node SO may be charged with the sensing node precharge voltage. The sensing node precharge voltage may be supplied from the voltage generator 151.

The latch block 340 is connected to the sensing node SO and is connected to the main sensing latch 350 and the adjacent sensing latch 360. The latch block 340 may receive a latch signal SLAT from the control logic circuit 150. The latch block 340 may transfer a voltage level of the sensing node SO to the main sensing latch 350 and the adjacent sensing latch 360 in response to the latch signal SLAT. The latch block 340 may compare a voltage level of the sensing node SO with a reference voltage in response to the latch signal SLAT.

In an embodiment, the latch block 340 may include a first transistor including a gate to which the latch signal SLAT is applied and a source to which a ground voltage is applied, and a second transistor including a source connected to a drain of the first transistor, a gate connected to the sensing node SO, and a drain connected to the main sensing latch 350 and the adjacent sensing latch 360. The first transistor may be turned on in response to the latch signal SLAT of a high level. The second transistor may be turned on in response to a sensing node (SO) voltage of the reference voltage or greater. For example, the reference voltage may be a threshold voltage of the second transistor. A voltage that is transferred from the latch block 340 to the main sensing latch 350 and the adjacent sensing latch 360 may be based on whether the second transistor is turned on. As such, the latch block 340 may set or reset the main sensing latch 350 and the adjacent sensing latch 360.

The main sensing latch 350 may be connected to the sensing node SO and the latch block 340. The main sensing latch 350 may latch data stored in a selected memory cell, based on a change in a voltage level of the sensing node SO. For example, the main sensing latch 350 may latch one of a first logical value and a second logical value at a node NS1 based on a result of the comparison performed by the latch block 340. The main sensing latch 350 may include a bias block 351, a dump block 352, inverters 353 and 354, set and reset transistors 355 and 356, and a reset block 357.

The bias block 351 may be connected to the sensing node SO and the node NS1. The bias block 351 may receive a bias signal SLBS from the control logic circuit 150. The bias block 351 may operate in response to the bias signal SLBS and may discharge the sensing node SO based on data of the node NS1.

In an embodiment, the bias block 351 may include a bias transistor including a first end (e.g., a drain) connected to the sensing node SO, a gate to which the bias signal SLBS is applied, and a second end (e.g., a source). The bias transistor may be turned on or turned off depending on a voltage level of the bias signal SLBS. The bias block 351 may further include a transistor including a first end (e.g., a source) connected to the second end of the bias transistor, a gate connected to the node NS1, and a second end (e.g., a drain) connected to the ground voltage. As such, based on data of the node NS1 and a voltage level of the bias signal SLBS, the bias block 351 may discharge a voltage level of the sensing node SO to the ground voltage or may allow the voltage level of the sensing node SO to be left alone. However, the configuration of the bias block 351 is not limited thereto.

The dump block 352 may be connected to the sensing node SO and the node NS1. The dump block 352 may transfer data of the node NS1 to the data block 370 or the adjacent sensing latch 360 in response to a dump signal SLDS.

In an embodiment, the dump block 352 may include a dump transistor including a first end (e.g., a source) connected to the sensing node SO, a gate to which the dump signal SLDS is applied, and a second end (e.g., a drain) connected to the node NS1. The dump transistor may be turned on or turned off depending on a voltage level of the dump signal SLDS. As the dump transistor operates, data of the node NS1 may be transferred to the data block 370 or the adjacent sensing latch 360 through the sensing node SO. However, the configuration of the dump block 352 is not limited thereto.

Each of the inverters 353 and 354 may be connected between a node NS0 and the node NS1. An input terminal of the inverter 353 may be connected to the node NS0, and an output terminal of the inverter 353 may be connected to the node NS1. An input terminal of the inverter 354 may be connected to the node NS1, and an output terminal of the inverter 354 may be connected to the node NS0. As such, voltage levels of the nodes NS0 and NS1 may correspond to opposite logical values, respectively. Below, data latched by the main sensing latch 350 may be understood as corresponding to data stored on the node NS1 connected to the bias block 351.

The set transistor 355 may be connected between the node NS0 and the latch block 340. The set transistor 355 may include a gate to which a set signal SET_S received from the control logic circuit 150 is applied. The set transistor 355 may be turned on or turned off in response to a voltage level of the set signal SET_S. When the set transistor 355 is turned on, a voltage that is based on a voltage of the sensing node SO transferred from the latch block 340 or a voltage transferred from the reset block 357 may be transferred to the node NS0.

The reset transistor 356 may be connected between the node NS1 and the latch block 340. The reset transistor 356 may include a gate to which a reset signal RST_S received from the control logic circuit 150 is applied. The reset transistor 356 may be turned on or turned off in response to a voltage level of the reset signal RST_S. When the reset transistor 356 is turned on, a voltage that is based on a voltage of the sensing node SO transferred from the latch block 340 or a voltage transferred from the reset block 357 may be transferred to the node NS1.

The reset block 357 may be connected to the set transistor 355 and the reset transistor 356. The reset block 357 may receive a latch reset signal SRSTS from the control logic circuit 150. The reset block 357 may transfer the ground voltage to the set transistor 355 and the reset transistor 356.

The adjacent sensing latch 360 may be connected to the sensing node SO and the latch block 340. The adjacent sensing latch 360 may latch data stored in an adjacent memory cell, based on a change in a voltage level of the sensing node SO. The adjacent sensing latch 360 may include a bias block 361, a dump block 362, inverters 363 and 364, set and reset transistors 365 and 366, and a reset block 367. Below, data latched by the adjacent sensing latch 360 may be understood as corresponding to data stored on a node NF1 connected to the bias block 361.

A way to implement the components 361 to 367 of the adjacent sensing latch 360 may be similar to the way to implement the components 351 to 357 of the main sensing latch 350, and operations of the components 361 to 367 of the adjacent sensing latch 360 may be similar to the operations of the components 351 to 357 of the main sensing latch 350. For example, the bias block 361, the dump block 362, the inverters 363 and 364, the transistors 365 and 366, and the reset block 367 of the adjacent sensing latch 360 may correspond to the bias block 351, the dump block 352, the inverters 353 and 354, the transistors 355 and 356, and the reset block 357 of the main sensing latch 350, respectively. The signals SLBS, SLDS, SET_S, RST_S, and SRSTS may correspond to signals SLBF, SLDF, SET_F, RST_F, and SRSTF. The nodes NS0 to NS1 may correspond to nodes NF0 to NF1, respectively.

The data block 370 may be connected to the sensing node SO. The data block 370 may receive data stored in the main sensing latch 350 and the adjacent sensing latch 360 through the sensing node SO. In an embodiment, the data block 370 may be implemented with a latch capable of storing data input thereto. The data block 370 may transmit the input data to the data input/output circuit 140 in response to a latch data output signal SLD.

Unlike the example illustrated in FIG. 3, the page buffer PBr may further include two or more latches connected to the sensing node SO. In an embodiment, the page buffer PBr may further include a latch for accumulating data stored in the main sensing latch 350. In this case, the dump blocks 352 and 362 may transfer data of the nodes NS1 and NF1 to latches (not illustrated) through the sensing node SO. The data block 370 may receive data through the sensing node SO from the latches.

Figure 4:
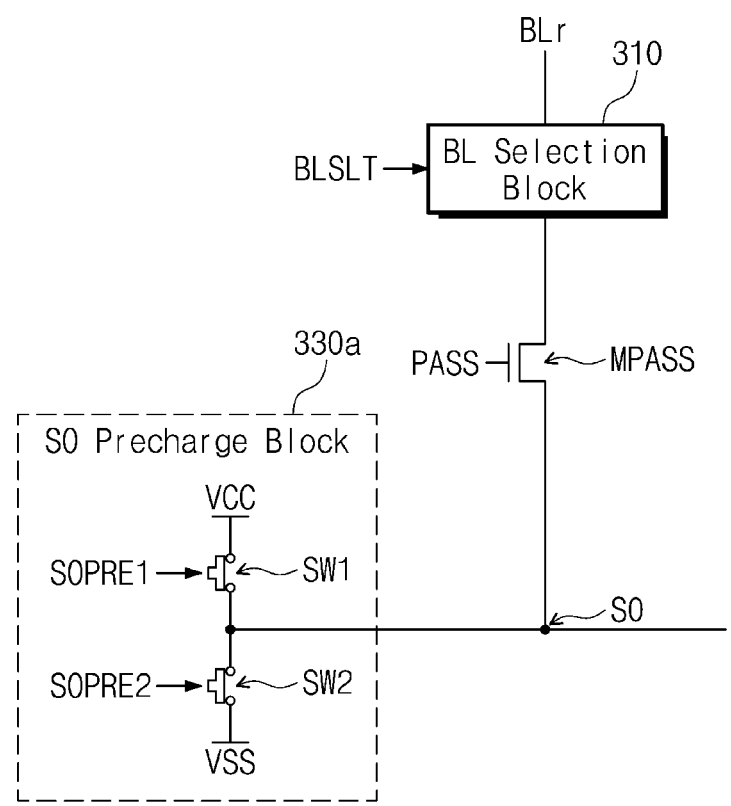
FIG. 4 is a block diagram illustrating a portion of a page buffer of FIG. 3 in detail according to example embodiments.

FIG. 4 is a block diagram illustrating a portion of a page buffer of FIG. 3 in detail according to example embodiments. Referring to FIGS. 1 and 4, a sensing node precharge block 330a of FIG. 4 may include switches SW1 and SW2. For convenience of description, the remaining components (e.g., the bit line precharge block 320 of FIG. 3) of the page buffer PBr are omitted.

The sensing node precharge signal SOPRE of FIG. 3 may include sensing node blocking signals SOPRE1 and SOPRE2 of FIG. 4. The switch SW1 may transfer a voltage VCC to the sensing node SO in response to the sensing node blocking signal SOPRE1. The switch SW2 may transfer a voltage VSS to the sensing node SO in response to the sensing node blocking signal SOPRE2. As such, under control of the control logic circuit 150, the sensing node precharge block 330a may charge the sensing node SO with the voltage VCC or may discharge a voltage of the sensing node SO to the voltage VSS (e.g., a ground voltage). However, a way to implement the sensing node precharge block 330 is not limited to the configuration of the sensing node precharge block 330a of FIG. 4.

Figure 5A:
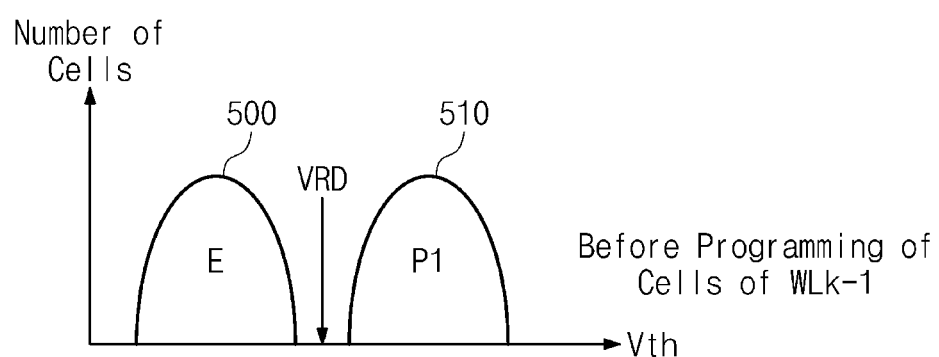
FIG. 5A illustrates threshold voltage distributions of selected memory cells connected to a selected word line before memory cells connected to an adjacent word line are programmed, according to an embodiment of the present disclosure.
Figure 5B:
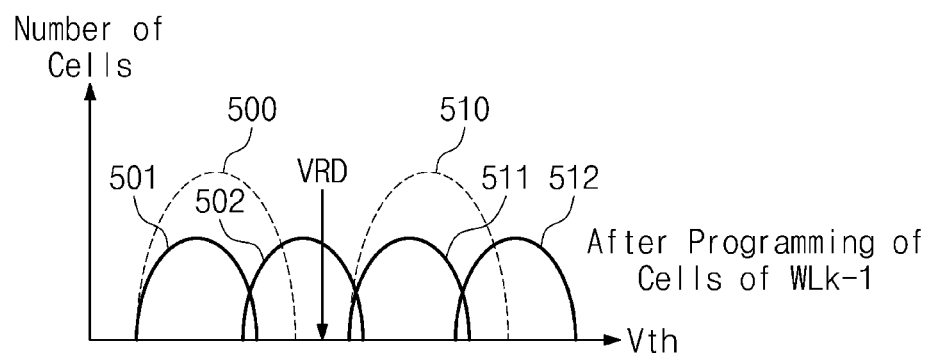
FIG. 5B illustrates threshold voltage distributions of selected memory cells connected to a selected word line after memory cells connected to an adjacent word line are programmed, according to an embodiment of the present disclosure.

FIG. 5A illustrates threshold voltage distributions of selected memory cells connected to a selected word line before memory cells connected to an adjacent word line (e.g., WLk−1) are programmed, according to an embodiment of the present disclosure. FIG. 5B illustrates threshold voltage distributions of selected memory cells connected to a selected word line after memory cells connected to an adjacent word line (e.g., WLk−1) are programmed, according to an embodiment of the present disclosure. In the embodiment illustrated in FIG. 5A, 1-bit data may be stored in one memory cell, but the present disclosure is not limited thereto. For example, X-bit data (X being a natural number of 1 or more) may be stored in one memory cell.

Referring to FIGS. 1 to 3, 5A, and 5B, a curve 500 and a curve 510 may respectively indicate a threshold voltage distribution of memory cells corresponding to an erase state "E" from among selected memory cells connected to a selected word line WLk and a threshold voltage distribution of memory cells corresponding to a program state P1 from among selected memory cells, after the selected memory cells are programmed and before adjacent memory cells connected to an adjacent word line WLk−1 are programmed. When a read voltage VRD is applied to the selected word line WLk by the row decoder circuit 120, the memory cells of the erase state "E" and the memory cells programmed to the program state P1 may be distinguished from each other.

When the adjacent memory cells connected to the adjacent word line WLk−1 are programmed, threshold voltage distributions of the selected memory cells may change as illustrated in FIG. 5B. For example, the memory cells belonging to the curve 500 (i.e., the memory cells of the erase state "E") may form threshold voltage distributions respectively corresponding to a curve 501 and a curve 502, and the memory cells belonging to the curve 510 (i.e., the memory cells of the program state P1) may form threshold voltage distributions respectively corresponding to a curve 511 and a curve 512. In this case, the degree of change in threshold voltages of the selected memory cells may be influenced by states to which the adjacent memory cells are programmed. For example, memory cells, which are less subjected to the coupling from the adjacent memory cells, from among the memory cells belonging to the curve 500 may belong to the curve 501, and memory cells, which are much subjected to the coupling from the adjacent memory cells, from among the memory cells belonging to the curve 500 may belong to the curve 502.

Referring to FIGS. 5A and 5B, threshold voltage distributions of the selected memory cells may widen due to the program operation performed on the adjacent memory cells connected to the adjacent word line WLk−1. In this case, when the read voltage VRD is used as a verification voltage, the accuracy of the read operation after the program operation is performed on the adjacent memory cells connected to the adjacent word line WLk−1 may be lower than before the program operation is performed on the adjacent memory cells connected to the adjacent word line WLk−1.

In the embodiment illustrated in FIGS. 5A and 5B, memory cells respectively connected to the word lines WL may be programmed in the descending order from highest to lowest values (or the ascending order from lowest to highest values). In other words, after the selected memory cells connected to the selected word line WLk being a k-th word line are programmed, the adjacent memory cells connected to the adjacent word line WLk−1 (or WLk+1) being a (k−1)-th (or (k+1)-th) word line may be programmed. As such, threshold voltages of the selected memory cells connected to the selected word line WLk may move due to the charge coupling between the selected memory cells and the adjacent memory cells when the memory cells connected to the adjacent word line WLk−1 or WLk+1 are programmed. A word line that influences the threshold voltages of the memory cells connected to the selected word line WLk may vary depending on a program sequence of the word lines WL.

Figure 6:
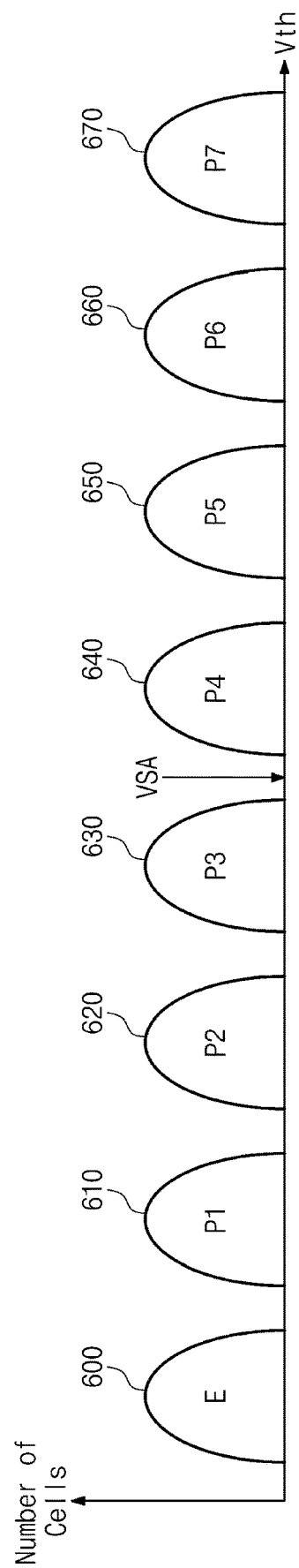
FIG. 6 illustrates threshold voltage distributions of adjacent memory cells connected to an adjacent word line.

FIG. 6 illustrates threshold voltage distributions of adjacent memory cells connected to an adjacent word line. In the embodiment illustrated in FIG. 6, 3-bit data may be stored in one memory cell, but the present disclosure is not limited thereto. Referring to FIGS. 1, 2, 5A, 5B, and 6, each of adjacent memory cells connected to the adjacent word line WLk−1 may be programmed to one of states "E" and P1 to P7. Curves 600, 610, 620, 630, 640, 650, 660, and 670 may respectively indicate threshold voltage distributions of adjacent memory cells of the erase state "E" and adjacent memory cells of the program states P1, P2, P3, P4, P5, P6, and P7.

In an embodiment, each of adjacent memory cells connected to the adjacent word line WLk−1 may be classified as an aggressor cell or a non-aggressor cell depending on the degree of interference exerted to selected memory cells (or the degree of coupling exerted to the selected memory cells). For example, the degree of interference that aggressor cells exert to the selected memory cells may be relatively great compared to the degree of interference that non-aggressor cells exert to the selected memory cells.

A voltage that is applied to control gates of memory cells, which are to be programmed to have a relatively great threshold voltage, from among adjacent memory cells may be relatively great when the memory cells are programmed. Accordingly, the coupling from the memory cells programmed to have a relatively great threshold voltage may be greater than the coupling from the memory cells programmed to have a relatively small threshold voltage. As such, in the embodiment illustrated in FIG. 6, memory cells having threshold voltages greater than a voltage VSA, for example, memory cells belonging to the curves 640 to 670 may be classified as aggressor cells, and memory cells having threshold voltages smaller than the voltage VSA, for example, memory cells belonging to the curves 600 to 630 may be classified as non-aggressor cells.

The number of groups into which adjacent memory cells are capable of being classified is not limited to the embodiment illustrated in FIG. 6. For example, unlike the embodiment illustrated in FIG. 6, adjacent memory cells may be classified by using two or more voltages. As such, adjacent memory cells may be classified into three or more groups (e.g., an aggressor cell, an intermediate-aggressor cell, a non-aggressor cell).

A level of the voltage VSA is not limited to the embodiment illustrated in FIG. 6. For example, unlike the embodiment illustrated in FIG. 6, a level of the voltage VSA may be determined between the curve 640 and the curve 650. In an embodiment, the number of groups into which adjacent memory cells are capable of being classified and a level of a voltage to be used to classify the adjacent memory cells may be adjusted by the control logic circuit 150.

Figure 7A:
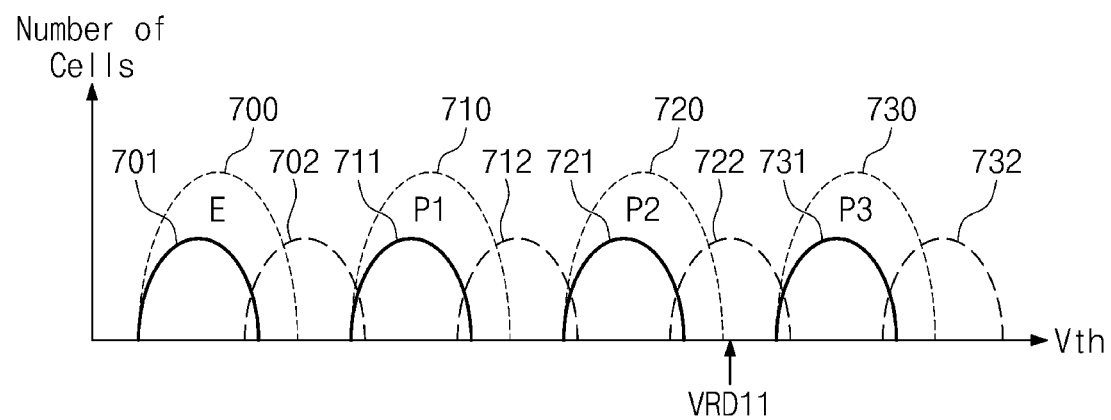
FIGS. 7A and 7B illustrate threshold voltage distributions of selected memory cells.
Figure 7B:
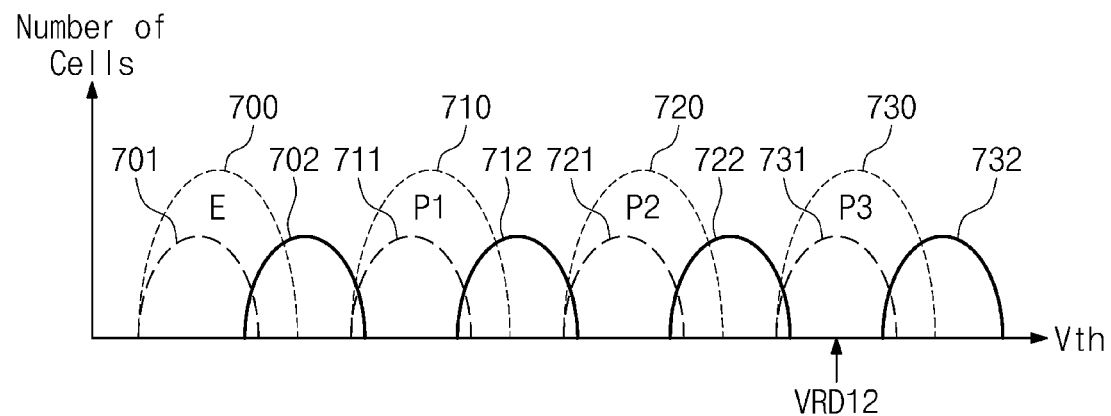

FIGS. 7A and 7B illustrate threshold voltage distributions of selected memory cells. In the embodiment illustrated in FIGS. 7A and 7B, 2-bit data may be stored in one memory cell, but the present disclosure is not limited thereto. A read operation of the nonvolatile memory device 100 will be described with reference to FIGS. 1 to 3, 5A, 5B, 6, 7A, and 7B.

In the nonvolatile memory device 100, a read operation (e.g., a data recovery read operation) may be performed on selected memory cells with reference to a result of a read operation performed on adjacent memory cells. For example, when the read operation is performed on the selected memory cells, first, data stored in adjacent memory cells may be sensed by the page buffer circuit 130. As in the above manner described with reference to FIG. 6, each of the adjacent memory cells may be classified as an aggressor cell or a non-aggressor cell based on a sensing result of each of the adjacent memory cells. Data stored in the selected memory cells may be sensed by the page buffer circuit 130 with reference to a result of classifying the adjacent memory cells.

In the embodiment illustrated in FIGS. 7A and 7B, each of the selected memory cells may be of one of states "E" and P1 to P3. Curves 700, 710, 720, and 730 may respectively indicate threshold voltage distributions of memory cells being in the states "E", P1, P2, and P3. When adjacent memory cells connected to the adjacent word line WLk−1 are programmed, threshold voltage distributions of the selected memory cells may change depending on the degree of influence exerted from the adjacent memory cells. For example, memory cells belonging to the curve 700 may form a threshold voltage distribution corresponding to the curve 701 or the curve 702, memory cells belonging to the curve 710 may form a threshold voltage distribution corresponding to the curve 711 or the curve 712, memory cells belonging to the curve 720 may form a threshold voltage distribution corresponding to the curve 721 or the curve 722, and memory cells belonging to the curve 730 may form a threshold voltage distribution corresponding to the curve 731 or the curve 732.

The memory cells belonging to the curves 701, 711, 721 and 731 may be memory cells influenced relatively less by the coupling from the adjacent memory cells, and the memory cells belonging to the curves 702, 712, 722, and 732 may be memory cells influenced relatively much by the coupling from the adjacent memory cells. In the embodiment illustrated in FIGS. 7A and 7B, the memory cells belonging to the curves 721 and 731 may be distinguishable by a read voltage VRD11, and the memory cells belonging to the curves 722 and 732 may be distinguishable by a read voltage VRD12. Accordingly, as memory cells (e.g., memory cells (hereinafter referred to as "non-victim cells") sharing bit lines with the non-aggressor cells) adjacent to non-aggressor cells from among selected memory cells, for example, memory cells belonging to the curves 701, 711, 721, and 731 marked by a solid line in FIG. 7A and memory cells (e.g., memory cells (hereinafter referred to as "victim cells") belonging to the curves 702, 712, 722, and 732 marked by a solid line in FIG. 7B) adjacent to aggressor cells are sensed by using different read voltages at different times, the read operation of the nonvolatile memory device 100 may be performed more accurately.

Figure 8A:
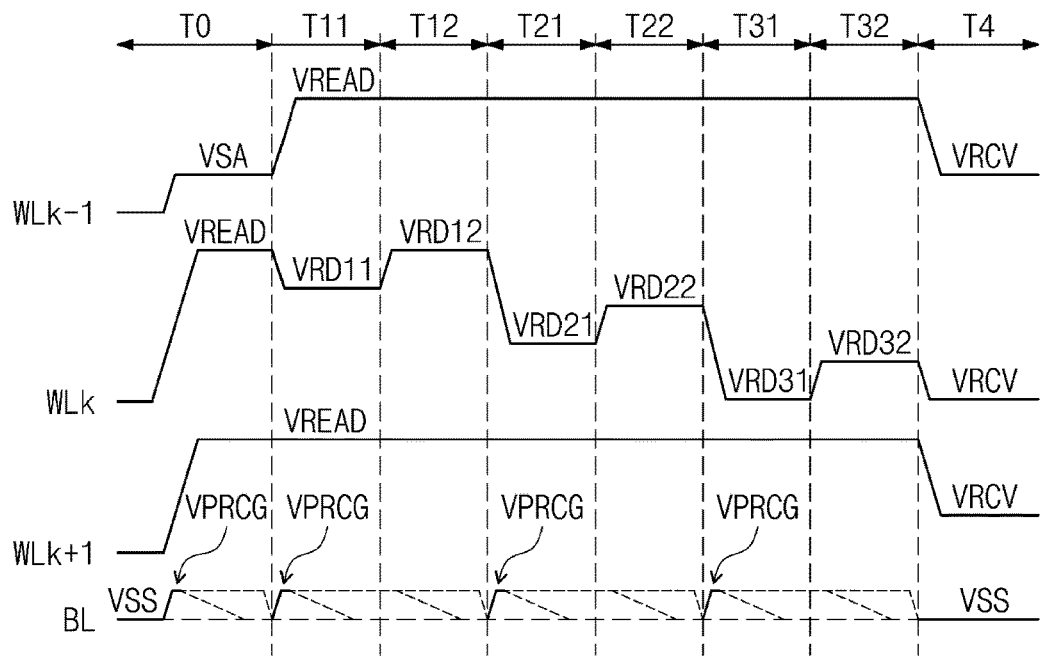
FIG. 8A illustrates a change in a voltage level as a read operation is performed on selected memory cells, according to an embodiment of the present disclosure.

FIG. 8A illustrates a change in a voltage level as a read operation is performed on selected memory cells, according to an embodiment of the present disclosure. Changes in voltage levels of the adjacent word line WLk−1, the selected word line WLk, a word line WLk+1 being not an adjacent word line, and the bit lines BL over time while the read operation is performed on selected memory cells will be described with reference to FIGS. 1 to 3, 5A, 5B, 6, 7A, 7B, and 8A. In the embodiment illustrated in FIGS. 8A and 8B, 2-bit data may be stored in one memory cell, but the present disclosure is not limited thereto.

When performing the read operation on the selected memory cells, the nonvolatile memory device 100 may first read data stored in adjacent memory cells and may classify the adjacent memory cells into aggressor cells and non-aggressor cells based on a result of performing the read operation on the adjacent memory cells. Next, the nonvolatile memory device 100 may read data stored in memory cells (i.e., non-victim cells), which are connected to bit lines (hereinafter referred to as "first bit lines") to which non-aggressor cells are connected, from among the selected memory cells and data stored in memory cells (i.e., victim cells), which are connected to bit lines (hereinafter referred to as "second bit lines") to which aggressor cells are connected, from among the selected memory cells at different times. Also, when the read operation is performed on the selected memory cells, the nonvolatile memory device 100 may latch data stored in the selected memory cells at least two times at main sensing latches of the page buffers PB0 to PBn−1.

In a time interval T0, data stored in the adjacent memory cells may be sensed. In the time interval T0, through the row decoder circuit 120, the voltage VSA may be applied to the adjacent word line WLk−1 of the word lines WL, and a voltage VREAD may be applied to the remaining word lines. The voltage VREAD may be higher in level than threshold voltages of memory cells programmed to the highest program state (e.g., P3). The page buffer circuit 130 may precharge all the bit lines BL. As such, voltage levels of the bit lines BL may increase from the voltage VSS to the bit line precharge voltage VPRCG.

As the corresponding voltages are applied to the word lines WL by the row decoder circuit 120, based on a state (e.g., an erase or program state) of a memory cell connected thereto, that is, data stored in the memory cells connected thereto, a voltage level of each of the bit lines BL may be maintained at the bit line precharge voltage VPRCG or may gradually decrease. For example, voltages of first bit lines connected to memory cells having threshold voltages greater than the voltage VSA may be maintained at the bit line precharge voltage VPRCG. In contrast, voltages of second bit lines connected to memory cells having threshold voltages equal to or smaller than the voltage VSA may gradually decrease as charges on the second bit lines are discharged to the common source line CSL.

As voltage levels of the bit lines BL change, voltage levels of sensing nodes connected to the bit lines BL may change. The data stored in the adjacent memory cells may be latched by the page buffer circuit 130, based on magnitudes of changes in the voltage levels of the sensing nodes. For example, when a voltage of a sensing node becomes smaller in level than a reference voltage, an adjacent memory cell connected to a relevant bit line may be determined as an on-cell. If not, the adjacent memory cell connected to the relevant bit line may be determined as an off-cell.

Voltages of sensing nodes of page buffers connected to first bit lines may become smaller than the reference voltage. As such, a first logical value (e.g., logic "0") may be latched as an adjacent sensing value at an adjacent sensing latch corresponding to a sensing node, the voltage of which becomes smaller than the reference voltage (or the first logical value being an initial value may be maintained at the adjacent sensing latch). In contrast, a second logical value (e.g., logic "1") may be latched as an adjacent sensing value at an adjacent sensing latch of a page buffer connected to a second bit line. In this case, the first logical value and the second logical value may be different. Below, it may be assumed that logic "0" is latched on a node connected to each of bias blocks of adjacent sensing latches each corresponding to an on-cell and logic "1" is latched on a node connected to each of bias blocks of adjacent sensing latches each corresponding to an off-cell, but the present disclosure is not limited thereto.

In time intervals T11 and T12, selected memory cells programmed to the program state P3 and selected memory cells programmed to the program state P2 may be distinguished based on the data stored in the adjacent memory cells. For example, in the time interval T11, threshold voltages of non-victim cells, for example, memory cells belonging to the curve 721 marked by a solid line of FIG. 7A and memory cells belonging to the curve 731 marked by a solid line of FIG. 7A may be distinguished. In the time interval T12, threshold voltages of victim cells, for example, memory cells belonging to the curve 722 marked by a solid line of FIG. 7B and memory cells belonging to the curve 732 marked by a solid line of FIG. 7B may be distinguished.

In the time interval T11, the row decoder circuit 120 may apply the read voltage VRD11 to the selected word line WLk and may apply the voltage VREAD to word lines (e.g., the adjacent word line WLk−1 and the word line WLk+1) being not the selected word line WLk. The page buffer circuit 130 may again precharge all the bit lines BL with the bit line precharge voltage VPRCG. Depending on data stored in the selected memory cells connected to the bit lines BL, voltage levels of the bit lines BL may be maintained at a level of the bit line precharge voltage VPRCG or may gradually decrease. For example, voltages of bit lines that are connected to memory cells having threshold voltages greater than the voltage VRD11, for example, memory cells belonging to the curves 731 and 732 and memory cells having threshold voltages greater than the voltage VRD11 from among memory cells belonging to the curve 722 may not change, but voltages of the remaining bit lines may decrease.

The page buffer circuit 130 may selectively precharge only sensing nodes corresponding to the first bit lines from among sensing nodes (in the embodiment illustrated in FIGS. 7A and 7B, sensing nodes corresponding to bit lines connected to memory cells belonging to the curves 701, 711, 721, and 731). Voltage levels of the sensing nodes selectively precharged may change depending on a change in voltage levels of bit lines respectively corresponding to the sensing nodes selectively precharged. The page buffers PB0 to PBn−1 may latch data values respectively corresponding to voltage changes of the sensing nodes (e.g., the sensing node SO of FIG. 3) at main sensing latches (e.g., the main sensing latch 350 of FIG. 3), respectively.

Sensing nodes respectively corresponding to second bit lines (in the embodiment illustrated in FIGS. 7A and 7B, bit lines connected to the curves 702, 712, 722, and 732) may not be precharged. For example, the sensing nodes not precharged may maintain a ground voltage VSS. In this case, a voltage(s) of a bit line(s) (hereinafter to as a "specific bit line(s)", which is connected to a memory cell belonging to the curve 732 and a memory cell having a threshold voltage greater than the voltage VRD11 from among the memory cells belonging to the curve 722, from among the second bit lines may be maintained at the bit line precharge voltage VPRCG. However, even though the specific bit lines are charged with the bit line precharge voltage, a voltage(s) of a sensing node(s) (hereinafter referred to as a "specific sensing node(s)") not precharged and corresponding to the specific bit line(s) may not increase to the reference voltage. Accordingly, the memory cells belong to the curve 732 and the memory cells having threshold voltages greater than the voltage VRD11 from among the memory cells belong to the curve 722 may be sensed as an on-cell.

For example, the amount of charges transferred between a sensing node and a bit line may be relatively small under the following condition: (a) the bit line is not connected to the common source line CSL, (b) a difference between the bit line precharge voltage VPRCG and the ground voltage VSS of the sensing node is not relatively great, or (c) a parasitic capacitance of the sensing node is smaller than a parasitic capacitance of the bit line. Also, the control logic circuit 150 may adjust a develop time of a sensing node by adjusting a time when the signal PASS of the high level is applied to the transistor MPASS. As such, the control logic circuit 150 may allow voltages of the sensing nodes corresponding to the specific bit lines not to increase to the reference voltage or greater.

As a result, a logical value corresponding to logic "1" may be latched at main sensing latches of page buffers connected to the memory cells belonging to the curve 731. In contrast, a logical value corresponding to logic "0" may be latched at main sensing latches of page buffers connected to the remaining memory cells belonging to curves 721, 722, and 732. Voltages of bit lines, which are connected to the memory cells belonging to the curve 732 and memory cells having threshold voltages greater than the voltage VRD11 from among the memory cells belonging to the curve 722, from among the second bit lines may be maintained at the bit line precharge voltage VPRCG. For example, voltages of bit lines, which are connected to the memory cells belonging to the curve 732 and the memory cells having threshold voltages greater than the voltage VRD11 from among the memory cells belonging to the curve 722, from among the second bit lines may be excluded from the read operation using the voltage VRD11.

In the time interval T12, the row decoder circuit 120 may apply the read voltage VRD12 to the selected word line WLk and may apply the voltage VREAD to the word lines being not the selected word line WLk. As such, voltage levels of bit lines connected to memory cells belonging to the curve 722 from among the voltage levels of the bit lines not decreasing in the time interval T11 may gradually decrease.

The page buffer circuit 130 may selectively precharge only sensing nodes corresponding to the second bit lines from among sensing nodes (in the embodiment illustrated in FIGS. 7A and 7B, sensing nodes corresponding to bit lines connected to the memory cells belonging to the curves 702, 712, 722, and 732). The page buffers PB0 to PBn−1 may latch data values corresponding to voltages of the sensing nodes at the main sensing latches once more. As such, as a main sensing value, logic "1" may be latched at main sensing latches corresponding to the memory cells belonging to the curve 732. As a result, main sensing latches of page buffers connected to the memory cells belonging to the curves 731 and 732 may store a logical value of logic "1", main sensing latches of the remaining page buffers may store a logical value of logic "0". As in the above manner described with reference to the time intervals T11 and T12, in time intervals T21 and T22, selected memory cells programmed to the program state P2 and selected memory cells programmed to the program state P1 may be distinguished based on the data stored in the adjacent memory cells. Likewise, in time intervals T31 and T32, selected memory cells programmed to the program state P1 and selected memory cells programmed to the program state 'E' may be distinguished based on the data stored in the adjacent memory cells. For example, each of the time intervals T21 and T31 may correspond to the time interval T11, and each of the time intervals T22 and T32 may correspond to the time interval T12. Each of the read voltages VRD21 and VRD31 may correspond to the read voltage VRD11, and each of the read voltages VRD22 and VRD32 may correspond to the read voltage VRD12.

In an time interval T4, the row decoder circuit 120 may apply a recovery voltage VRCV to all the word lines WL. In this case, the recovery voltage VRCV may be identical to a ground voltage or may be a voltage greater than the ground voltage. Voltages of the bit lines BL may be identical in level to the voltage VSS.

Figure 8B:
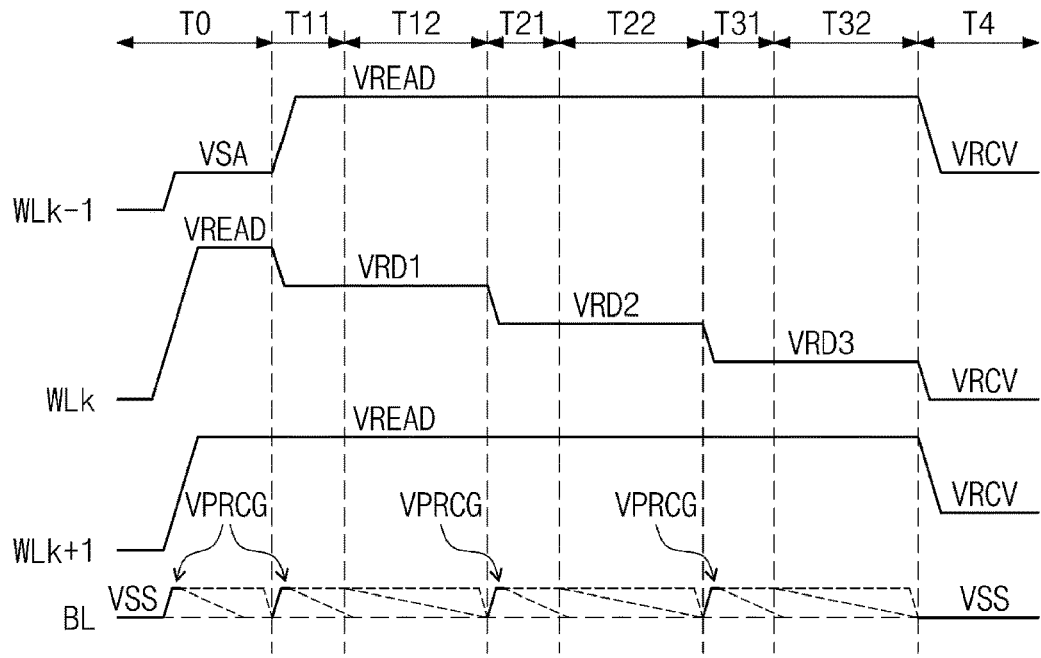
FIG. 8B illustrates a change in a voltage level as a read operation is performed on selected memory cells, according to another embodiment of the present disclosure.

FIG. 8B illustrates a change in a voltage level as a read operation is performed on selected memory cells, according to another embodiment of the present disclosure. Referring to FIGS. 1 to 3, 5A, 5B, 6, 7A, 7B, and 8A, a difference between the embodiments of FIGS. 8A and 8B will be described below.

Unlike the embodiment illustrated in FIG. 8A, in the time intervals T11 and T12 of FIG. 8B, the row decoder circuit 120 may apply a read voltage VRD1 to the selected word line WLk. The read voltage VRD1 may be greater than the read voltage VRD11 of FIG. 8A. For example, the read voltage VRD1 may be greater than threshold voltages of memory cells belonging to the curve 722 and may be smaller than threshold voltages of memory cells belonging to the curve 732.

A length of the time interval T11 and a length of the time interval T12 may be different. For example, the length of the time interval T11 may be smaller than the length of the time interval T12. Because the length of the time interval T11 is small, changes in voltage levels of the first bit lines may not be sufficiently applied to the sensing nodes connected to the first bit lines in the time interval T11. In other words, even though a voltage level of a bit line decreases, a voltage level of a sensing node corresponding to the bit line may not decrease sufficiently as much as the decrease in the voltage level of the bit line.

For example, even though a threshold voltage of a memory cell is smaller than the read voltage VRD1, as the threshold voltage becomes closer to the read voltage VRD1, the variation in the voltage level of the bit line may become relatively smaller. Accordingly, in the case where a sensing node corresponds to a first bit line connected to a memory cell having a threshold voltage close to the read voltage VRD1, a voltage level of the sensing node may not sufficiently decrease. As such, not a logical value corresponding to logic "0" but a logical value corresponding to logic "1" may be latched at a main sensing latch connected to the first bit line connected to the memory cell having the threshold voltage close to the read voltage VRD1. As a result, even though the read voltage VRD1 is applied to the selected word line WLk, substantially the same result as when the read voltage VRD11 of FIG. 8A, for example, a voltage smaller in level than the read voltage VRD1 is applied to the selected word line WLk may be obtained.

Figure 9:
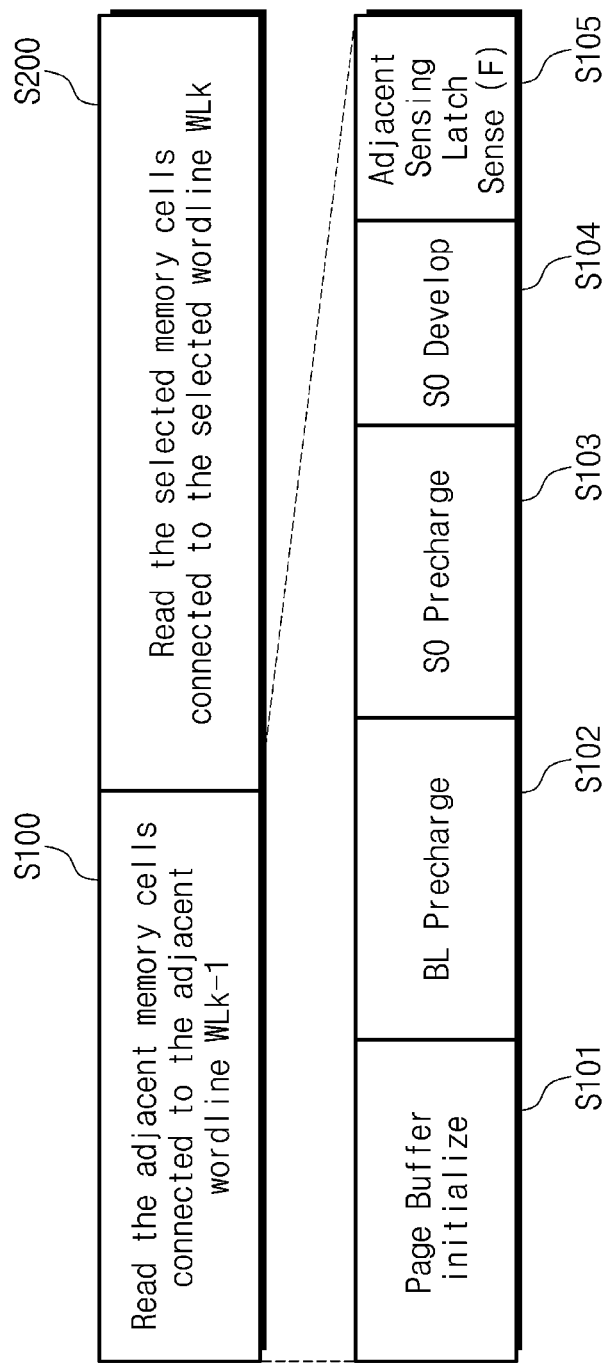
FIG. 9 illustrates a flowchart of a method of reading selected memory cells, according to an embodiment of the present disclosure.

FIG. 9 illustrates a flowchart of a method of reading selected memory cells, according to an embodiment of the present disclosure. Referring to FIGS. 1 to 3, 6, 8B, and 9, a method in which the nonvolatile memory device 100 reads selected memory cells may include operation S100 and operation S200.

In operation S100, the nonvolatile memory device 100 may read the adjacent memory cells connected to the adjacent word line WLk-1. For example, the row decoder circuit 120 of the nonvolatile memory device 100 may select (or activate) the adjacent word line WLk-1. The page buffer circuit 130 of the nonvolatile memory device 100 may sense data stored in the adjacent memory cells and may latch the sensed data at adjacent sensing latches, respectively.

In operation S200, the nonvolatile memory device 100 may read the selected memory cells connected to the selected word line WLk. For example, the nonvolatile memory device 100 may perform operation S200 based on a result of operation S100. Operation S200 will be more fully described later.

Operation S100 may include operation S101 to operation S105. In operation S101, the nonvolatile memory device 100 may initialize the page buffer circuit 130. For example, components of the page buffers PB0 to PBn-1 may be initialized based on the signals (e.g., BLSLT, BLPRE, SOPRE, SLAT, SLBD, SLDS, SET_S, RST_S, SRSTS, SLBF, SLDF, SET_F, RST_F, SRSTF, and SLD of FIG. 3) applied from the control logic circuit 150 to the page buffers PB0 to PBn-1 of the page buffer circuit 130. As such, logic "0" being an initial value may be latched at main sensing latches and adjacent sensing latches.

In operation S102, the nonvolatile memory device 100 may precharge the bit lines BL. For example, the page buffers PB0 to PBn-1 of the page buffer circuit 130 may charge the bit lines with the bit line precharge voltage VPRCG in response to the bit line precharge signal BLPRE of the high level and the bit line selection signal BLSLT of the high level, which are received from the control logic circuit 150.

In operation S103, the nonvolatile memory device 100 may precharge sensing nodes. For example, each of the page buffers PB0 to PBn-1 may charge the sensing node SO with a sensing node precharge voltage in response to the sensing node precharge signal SOPRE of the high level, which is received from the control logic circuit 150. The nonvolatile memory device 100 may apply the voltage VSA to the adjacent word line WLk-1.

In operation S104, the nonvolatile memory device 100 may develop the sensing nodes. For example, each of the page buffers PB0 to PBn-1 may electrically connect the sensing node SO to the corresponding bit line in response to the signal PASS received from the control logic circuit 150. In this case, as voltage levels of the corresponding bit lines changes, voltage levels of the sensing nodes may change.

Figure 10:
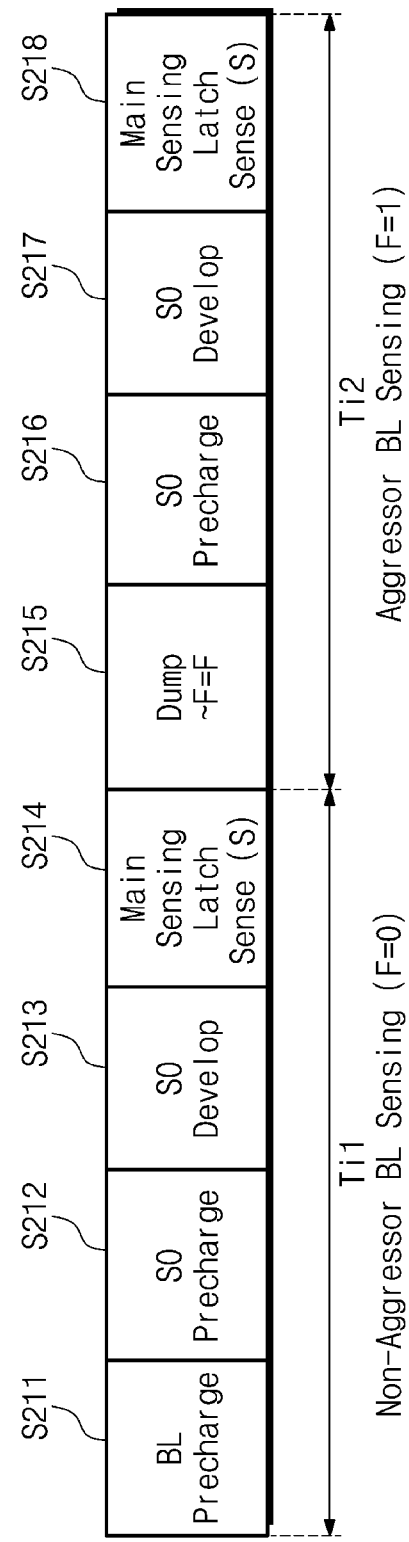
FIG. 10 illustrates operation S200 of FIG. 9 in detail according to example embodiments.

In operation S105, the nonvolatile memory device 100 may latch data stored in the adjacent memory cells at the adjacent sensing latches. For example, the set signal SET_F of the high level may be applied to the page buffers PB0 to PBn-1. As the set signal SET_F of the high level is applied to the adjacent sensing latches (e.g., 360), each of the adjacent sensing latches may sense data stored in the corresponding adjacent memory cell based on a change in a voltage level of the corresponding sensing node and may store a logical value corresponding to the sensed data as an adjacent sensing result. Below, the adjacent sensing result may be expressed by "F", FIG. 10 illustrates operation S200 of FIG. 9 in detail according to example embodiments. Referring to FIGS. 1 to 3, 8B, 9, and 10, operation S200 may include operation S211 to operation S218.

The nonvolatile memory device 100 may perform operation S211 to operation S214 in an time interval Ti1 and may perform operation S215 to operation S218 in an time interval Ti2. For example, the time interval Ti1 may correspond to the time interval T11, and the time interval Ti2 may correspond to the time interval T12. In the time interval Ti1, the nonvolatile memory device 100 may perform the read operation so as to be focused on memory cells (i.e., non-victim cells) connected to the first bit lines from among selected memory cells belonging to a state (e.g., the program state P2) (hereinafter referred to as a "target state") to be distinguished. In the time interval Ti2, the nonvolatile memory device 100 may perform the read operation so as to be focused on memory cells (i.e., victim cells) connected to the second bit lines from among the selected memory cells belonging to the target state. Only sensing nodes corresponding to the first bit lines may be precharged in the time interval Ti1, and only sensing nodes corresponding to the second bit lines may be precharged in the time interval Ti2.

In operation S211, the nonvolatile memory device 100 may precharge the bit lines BL. For example, the nonvolatile memory device 100 may perform operation S211 in a manner similar to the manner in operation S102 described above.

In operation S212, the nonvolatile memory device 100 may selectively precharge only sensing nodes corresponding to the first bit lines from among sensing nodes. For example, the sensing node precharge signal SOPRE of the high level may be applied to a sensing node precharge block (e.g., 330) of each of the page buffers PB0 to PBn-1, and a bias signal SLBF of the high level may be applied to a bias block (e.g., 361) of an adjacent sensing latch (e.g., 360) thereof. As such, sensing nodes (or sensing nodes of page buffers in which logic "1" is stored as "F") corresponding to the second bit lines from among the sensing nodes may be discharged based on logical values of data stored in the adjacent sensing latches, and only sensing nodes (or sensing nodes of page buffers in which logic "0" is stored as "F") corresponding to the first bit lines from among the sensing nodes may be charged with the sensing node precharge voltage.

In operation S213, the nonvolatile memory device 100 may develop the sensing nodes. For example, the nonvolatile memory device 100 may perform operation S213 in a manner similar to the manner in operation S104 described above. In this case, a length of a time when operation S213 is performed may be smaller than a length of a time when operation S104 is performed. The control logic circuit 150 may adjust a time when operation S213 is performed, by adjusting a time when the signal PASS has the high level.

In operation S214, the nonvolatile memory device 100 may latch data stored in the selected memory cells at the main sensing latches. For example, each of the main sensing latches (e.g., 350) of the page buffers PB0 to PBn−1 may sense data stored in the corresponding selected memory cell based on a change in a voltage level of the corresponding sensing node and may store a logical value corresponding to the sensed data as a main sensing result. Below, the main sensing result may be expressed by "S", In operation S215, the nonvolatile memory device 100 may dump data stored in the adjacent sensing latches. As such, the nonvolatile memory device 100 may invert the adjacent sensing results "F" ("~F=F"). For example, the page buffers PB0 to PBn−1 may invert (or flip) the logical values of the data stored in the adjacent sensing latches. As such, data corresponding to logic "0" may be changed to data corresponding to logic "1", and data corresponding to logic "1" may be changed to data corresponding to logic "0". In other words, voltage levels of nodes (e.g., NF0 and NF1) corresponding to opposite ends of an inverter of an adjacent sensing latch may be inverted (or flipped).

In operation S216, the nonvolatile memory device 100 may selectively precharge only sensing nodes corresponding to the second bit lines from among the sensing nodes. For example, as in the above manner described in operation S212, the sensing node precharge signal SOPRE of the high level may be applied to the sensing node precharge block of the page buffers PB0 to PBn−1, and the bias signal SLBF of the high level may be applied to the bias blocks of the adjacent sensing latches. Unlike operation S212, in operation S215, the sensing nodes corresponding to the first bit lines from among the sensing nodes may be discharged, and only the sensing nodes corresponding to the second bit lines may be charged with the sensing node precharge voltage.

In operation S217, the nonvolatile memory device 100 may develop the sensing nodes. For example, the nonvolatile memory device 100 may perform operation S217 in a manner similar to the manner in operation S104 described above. In this case, a length of a time when operation S217 is performed may be greater than a length of a time when operation S213 is performed.

In operation S218, the nonvolatile memory device 100 may latch data stored in the selected memory cells at the main sensing latches. For example, the nonvolatile memory device 100 may perform operation S218 in a manner similar to the manner in operation S214 described above.

According to an embodiment of the present disclosure, values obtained by sensing the selected memory cells may be stored in the main sensing latches regardless of the bit lines BL. In other words, main sensing values corresponding to the first bit lines and main sensing values corresponding to the second bit lines may be stored in the same latches. As such, the area of the page buffer circuit 130 of the nonvolatile memory device 100 according to an embodiment of the present disclosure may decrease.

According to another embodiment of the present disclosure, a time for developing sensing nodes in sensing memory cells connected to the first bit lines may be shorter than a time for developing sensing nodes in sensing memory cells connected to the second bit lines. As such, substantially the same effect as there is used a voltage smaller in level than a read voltage actually applied to the selected word line WLk may be accomplished. Therefore, there may be no need to change a voltage to be applied to a word line. As such, the performance of the read operation of the nonvolatile memory device 100 may be improved.

Figure 11:
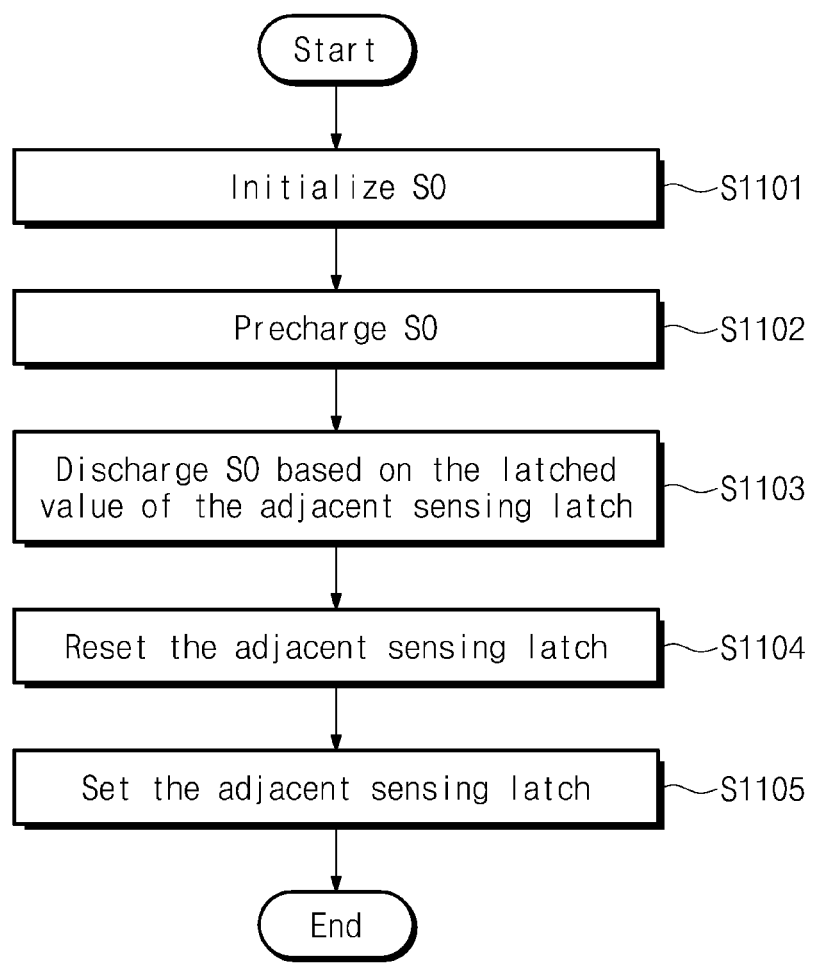
FIG. 11 illustrates operation S215 of FIG. 10 in detail according to example embodiments.

FIG. 11 illustrates operation S215 of FIG. 10 in detail according to example embodiments. Referring to FIGS. 1 to 4, 8B, 10, and 11, operation S215 may include operation S1101 to operation S1105.

In operation S1101, the nonvolatile memory device 100 may initialize sensing nodes. For example, the sensing nodes may be discharged to a level of the voltage VSS in response to a signal SOPRE2 of the high level, which is applied from the control logic circuit 150.

In operation S1102, the nonvolatile memory device 100 may precharge all the sensing nodes. For example, all the sensing nodes may be precharged in response to a signal SOPRE1 of the high level, which is applied from the control logic circuit 150.

In operation S1103, the nonvolatile memory device 100 may discharge a part of the sensing nodes based on data stored in adjacent sensing latches. For example, only sensing nodes connected to adjacent sensing latches in which adjacent sensing results of "1" are respectively stored may be discharged in response to the bias signal SLBF of the high level, which is applied from the control logic circuit 150 to bias blocks of the adjacent sensing latches.

In operation S1104, the nonvolatile memory device 100 may reset the adjacent sensing latches. For example, the adjacent sensing latches may be reset in response to the reset signal RST_F of the high level and the latch reset signal SRSTF of the high level.

In operation S1105, the nonvolatile memory device 100 may set the adjacent sensing latches. For example, the latch signal SLAT of the high level and the set signal SET_F of the high level may be applied to latch blocks and the adjacent sensing latches of the page buffer circuit 130 from the control logic circuit 150. Voltage levels of the sensing nodes may be respectively applied to the adjacent sensing latches in response to the latch signal SLAT of the high level and the set signal SET_F of the high level. As such, logic "0" may be latched at adjacent sensing latches in which adjacent sensing results of "1" stored before operation S1104 are respectively stored, and vice versa.

Figure 12:
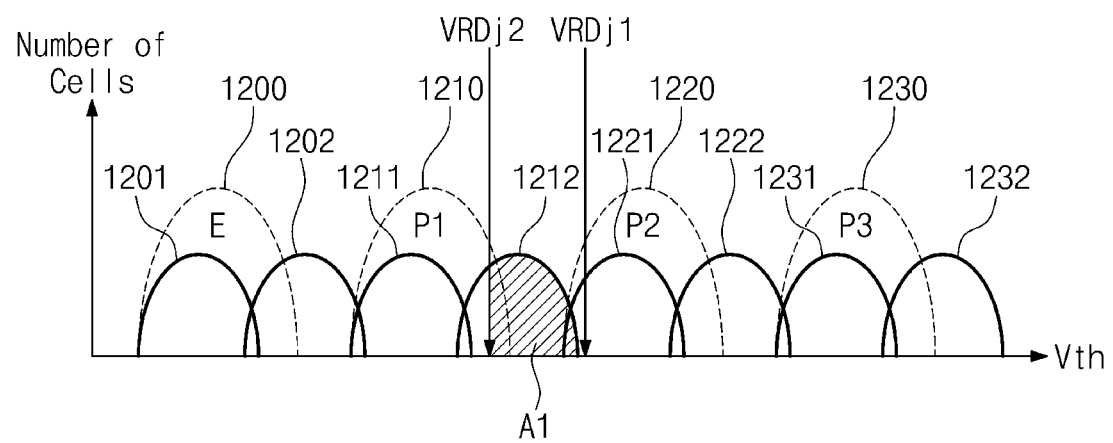
FIG. 12 illustrates threshold voltage distributions of selected memory cells according to an embodiment of the present disclosure.

FIG. 12 illustrates threshold voltage distributions of selected memory cells according to an embodiment of the present disclosure. In the embodiment illustrated in FIG. 12, 2-bit data may be stored in one memory cell, but the present disclosure is not limited thereto. Referring to FIGS. 1 to 3 and 12, FIG. 12 shows a part of threshold voltage distributions of selected memory cells after adjacent memory cells are programmed. For example, FIG. 12 shows threshold voltage distributions of memory cells programmed to the erase state "E" or one of the program states P1, P2, and P3 from among the selected memory cells.

Curves 1200, 1210, 1220, and 1230 may respectively indicate threshold voltage distributions of selected memory cells of the erase state "E" and selected memory cells programmed to the program states P1, P2, and P3 before adjacent memory cells are programmed. As the adjacent memory cells are programmed, memory cells belonging to the curve 1200 may belong to one of curves 1201 and 1202, memory cells belonging to the curve 1210 may belong to one of curves 1211 and 1212, memory cells belonging to the curve 1220 may belong to one of curves 1221 and 1222, and memory cells belonging to the curve 1230 may belong to one of curves 1231 and 1232.

In the embodiment illustrated in FIG. 12, when a voltage VRDj2 is applied to a selected word line, memory cells included in a shaded area A1 from among memory cells belonging to the curve 1212 may be abnormally recognized as being not programmed to the program state P1. Also, when the voltage VRDj1 is applied to the selected word line, memory cells having threshold voltages smaller than the voltage VRDj1 from among memory cells belonging to the curve 1221 may be abnormally recognized as being programmed to the program state P1.

In an embodiment, the nonvolatile memory device 100 may precharge all sensing nodes and may apply the voltage VRDj1 to a selected word line. As such, the nonvolatile memory device 100 may distinguish memory cells belonging to the curves 1222, 1231, and 1232 and memory cells having threshold voltages greater than the voltage VRDj1 from among memory cells belonging to the curve 1221 from memory cells belonging to the curves 1201, 1202, 1211, and 1212 and memory cells having threshold voltages smaller than the voltage VRDj1 from among the memory cells belonging to the curve 1221 (i.e., the remaining memory cells of the memory cells belonging to the curve 1221). Afterwards, the nonvolatile memory device 100 may selectively precharge only sensing nodes corresponding to memory cells having threshold voltages greater than the voltage VRDj1 and memory cells belonging to the curve 1211 and may apply the voltage VRDj2 to the selected word line. As a result, the number of memory cells abnormally recognized as a different program state may be less than that in the case where only one of the voltages VRDj1 and VRDj2 is used.

Below, a read operation associated with FIG. 12 will be more fully described with reference to FIGS. 12 and 13.

Figure 13:
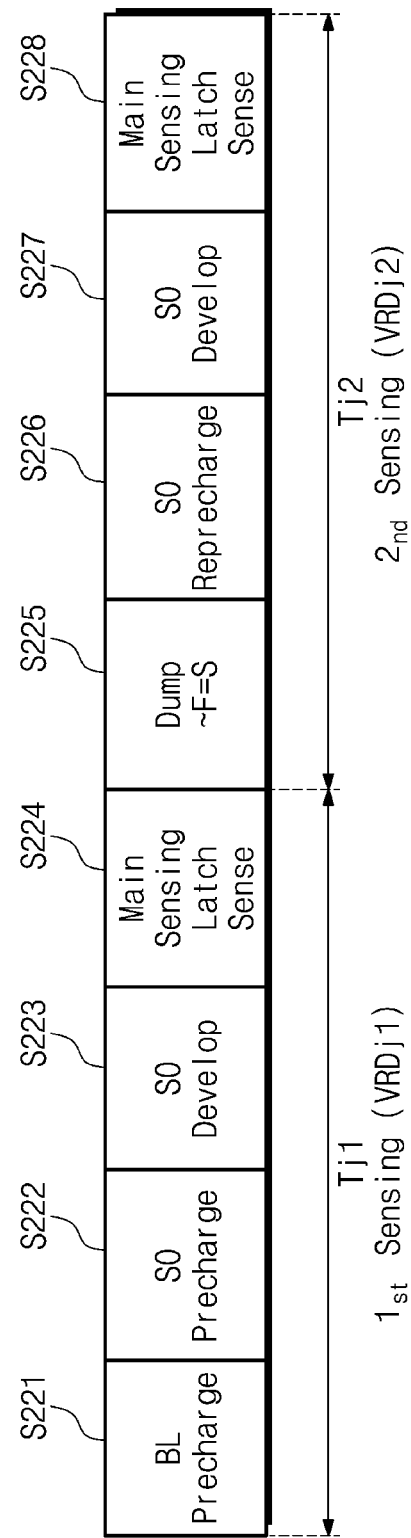
FIG. 13 illustrates operation S200 of FIG. 9 according to another embodiment of the present disclosure in detail.

FIG. 13 illustrates operation S200 of FIG. 9 according to another embodiment of the present disclosure in detail. Referring to FIGS. 1 to 3, 8B, 9, 12, and 13, operation S200 may include operation S221 to operation S228. The nonvolatile memory device 100 may perform first sensing in an time interval Tj1 and may perform second sensing in an time interval Tj2.

The nonvolatile memory device 100 may perform operation S221 to operation S224 in the time interval Tj1 and may perform operation S225 to operation S228 in the time interval Tj2. For example, the time interval Tj1 may be an time interval where a read operation using the voltage VRDj1 is performed. The time interval Tj2 may be an time interval where a read operation using the voltage VRDj2 is performed. Alternatively, a level of a voltage applied from the row decoder circuit 120 to the selected word line WLk in the time interval Tj1 may be equal to a level of a voltage applied from the row decoder circuit 120 to the selected word line WLk in the time interval Tj2. For example, in the time intervals Tj1 and Tj2, a voltage (e.g., the voltage VRDj1) that is greater than threshold voltages of memory cells belonging to the curve 1212 and smaller than threshold voltages of memory cells belonging to the curve 1222 may be applied to the selected word line WLk. A level of a voltage that is applied to the selected word line WLk may be adjusted by the control logic circuit 150. When a voltage applied to the selected word line WLk is uniform, a time for develop (e.g., operation S223) of the time interval Tj1 may be shorter than a time for develop (e.g., operation S226) of the time interval Tj2.

In an embodiment, the nonvolatile memory device 100 may perform the first sensing by performing the read operation so as to be focused on victim cells (e.g., memory cells belonging to the curve 1212) of selected memory cells of a target state (e.g., the program state P1). In the time interval Tj2, the nonvolatile memory device 100 may again precharge the remaining sensing nodes other than the sensing nodes corresponding to the victim cells, based on a result of performing the first sensing. The nonvolatile memory device 100 may perform the second sensing by performing the read operation so as to be focused on non-victim cells (e.g., memory cells belonging to the curve 1211) of the selected memory cells of the target state.

In performing the second sensing, while the second sensing is performed, the nonvolatile memory device 100 may adjust a develop time of sensing nodes (i.e., a time during which the signal PASS of the high level is applied to the page buffer circuit 130) such that voltage levels of sensing nodes of memory cells determined as an on-cell based on the first sensing result do not increase to the reference value or greater due to the influence of the corresponding bit lines. As such, memory cells that are programmed to have a threshold voltage greater than an upper limit of the target state may not be abnormally recognized as the target state. As a result, the accuracy of the read operation may be improved.

In operation S221, the nonvolatile memory device 100 may precharge the bit lines BL. For example, the nonvolatile memory device 100 may perform operation S221 in a manner similar to the manner in operation S101 described above.

In operation S222, the nonvolatile memory device 100 may precharge all the sensing nodes. For example, the sensing node precharge signal SOPRE of the high level may be applied to a sensing node precharge block (e.g., 330) of each of the page buffers PB0 to PBn-1, and the bias signal SLBF of the low level may be applied to a bias block (e.g., 361) of an adjacent sensing latch (e.g., 360) thereof. As such, all the sensing nodes may be charged with the sensing node precharge voltage.

In operation S223, the nonvolatile memory device 100 may develop the sensing nodes. For example, the nonvolatile memory device 100 may perform operation S223 in a manner similar to the manner in operation S104 described above.

In operation S224, the nonvolatile memory device 100 may latch data stored in the selected memory cells at the main sensing latches. For example, the nonvolatile memory device 100 may perform operation S224 in a manner similar to the manner in operation S214 described above.

In operation S225, the nonvolatile memory device 100 may dump the adjacent sensing results "F" to the main sensing latches. As such, the nonvolatile memory device 100 may set main sensing results "S" stored in main sensing latches corresponding to adjacent sensing latches, in which adjacent sensing results "F" are logic "0", to logic "1" ("~F=S"). Operation S225 will be more fully described later.

In operation S226, the nonvolatile memory device 100 may again selectively precharge a part of the sensing nodes. For example, the nonvolatile memory device 100 may flip (or invert) the main sensing results "S" in a manner similar to the manner in operation S215 described above. The sensing nodes of the page buffers PB0 to PBn−1 may be discharged based on the main sensing results "S" after precharged, and the main sensing latches may again be set after being reset. After the main sensing results latched by the main sensing latches are flipped, the sensing node precharge signal SOPRE of the high level may be applied to the sensing node precharge blocks of the page buffers PB0 to PBn−1, and the bias signal SLBS of the high level may be applied to the main sensing latches. As such, unlike operation S222, in operation S225, sensing nodes connected to main sensing latches, in which main sensing results stored in operation S224 correspond to logic "0", from among the sensing nodes and sensing nodes connected to the second bit lines may be discharged, and sensing nodes connected to main sensing latches corresponding to logic "1" and sensing nodes connected to the first bit lines may be selectively precharged.

In operation S227, the nonvolatile memory device 100 may reset the main sensing latches. For example, the main sensing latches may be reset in response to the reset signal RST_S of the high level and the latch reset signal SRSTS of the high level.

In operation S227, the nonvolatile memory device 100 may develop the sensing nodes. For example, the nonvolatile memory device 100 may perform operation S227 in a manner similar to the manner in operation S104 described above. In this case, unlike operation S213 and operation S217 of FIG. 10, a length of a time when operation S217 is performed may be smaller than a length of a time when operation S223 is performed. Accordingly, substantially the same result as when a voltage smaller in level than a voltage actually applied to the selected word line WLk by the row decoder circuit 120 is applied to the selected word line WLk by the row decoder circuit 120 may be accomplished. In operation S228, the nonvolatile memory device 100 may latch data stored in the selected memory cells at the main sensing latches. For example, the nonvolatile memory device 100 may perform operation S228 in a manner similar to the manner in operation S214 described above.

TABLE 1

| | | Curve 1202 | Curve 1211 | Curve 1212 | Curve 1221 | | Curve 1222 |
| | | | | | Vth < VRDj1 | Vth ≥ VRDj1 | |
|---|---|---|---|---|---|---|---|
| 1st Sensing (S224) | F | 1 | 0 | 1 | | 0 | 1 |
| | S | 0 | 0 | 0 | 0 | 1 | 1 |
| Dump | F | 1 | 0 | 1 | | 0 | 1 |
| ~F = S (S225) | S | 0 | 1 | 0 | 1 | 1 | 1 |
| Inversion (S225) | F | 1 | 0 | 1 | | 0 | 1 |
| | S | 1 | 0 | 1 | 0 | 0 | 0 |
| Repharge (S226) | SO | 0 | 1 | 0 | 1 | 1 | 1 |
| 2nd Sensing (S228) | F | 1 | 0 | 1 | | 0 | 1 |
| | S | 0 | 0 | 0 | 1 | 1 | 1 |

In an embodiment, Table 1 above shows results of perform operation S100 and operation S221 to operation S228 with regard to memory cells belonging to the curves 1202, 1211, 1212, 1221, and 1222. As a result of operation S100, logic "0" may be latched at adjacent sensing latches corresponding to the first bit lines (in Table 1, adjacent sensing results "F" corresponding to the curves 1211 and 1221), and logic "1" may be latched at adjacent sensing latches corresponding to the second bit lines (in Table 1, adjacent sensing results "F" corresponding to the curves 1202, 1212, and 1222).

After operation S221 to operation S223, in operation S224, logic "0" may be latched at main sensing latches corresponding to memory cells having threshold voltages smaller than the voltage VRDj1 from among the selected memory cells, and logic "1" may be latched at main sensing latches corresponding to memory cells having threshold voltages equal to or greater than the voltage VRDj1.

In operation S225, main sensing latches corresponding to adjacent sensing latches in which logic "1" is latched and main sensing latches, in which logic "1" is latched in operation S224, from among main sensing latches corresponding to adjacent sensing latches in which logic "0" is latched may maintain logical values latched in operation S224. In contrast, logic "1" may be latched at main sensing latches, in which logic "0" is latched in operation S224, from among the main sensing latches corresponding to the adjacent sensing latches in which logic "0" is latched (In Table 1, main sensing results "S" corresponding to memory cells having threshold voltages smaller than the voltage VRDj1 from among memory cells belonging to the curve 1201 and the curve 1212).

In operation S226, the page buffer circuit 130 may invert latch values latched at the main sensing latches. Afterwards, the bias signal SLBS of the high level associated with the main sensing latches and the sensing node precharge signal SOPRE of the high level may be applied to the page buffer circuit 130. As such, sensing nodes corresponding to main sensing latches in which inverted main sensing values are logic "1" may be discharged (in Table 1, "1" of sensing nodes corresponding to curves 1202 and 1212), and only sensing nodes corresponding to main sensing latches in which inverted main sensing values are logic "0" may be precharged (in Table 1, "0" of sensing nodes corresponding to the curves 1211, 1221, and 1222).

In operation S227, the main sensing latches may be reset, and the sensing nodes may be developed. As such, in operation S228, main sensing latches corresponding to sensing nodes not precharged in operation S226 may maintain logic "0" (in Table 1, main sensing results "S" corresponding to the curves 1202 and 1212). Also, main sensing latches corresponding to memory cells having threshold voltages smaller than the voltage VRDj2 from among the main sensing latches corresponding to the sensing nodes again precharged in operation S226 may also maintain logic "0" (in Table 1, main sensing results "S" corresponding to the curve 1211). In contrast, logic "1" may be latched at main sensing latches corresponding to memory cells having threshold voltages equal to or greater than the voltage VRDj2 from among the main sensing latches corresponding to the sensing nodes again precharged in operation S226 (in Table 1, main sensing results "S" corresponding to the curves 1221 and 1222). As a result, by performing operation S221 to operation S228, the nonvolatile memory device 100 may distinguish memory cells programmed to the program state P1 from memory cells programmed to the program state P2 with high accuracy.

Figure 14:
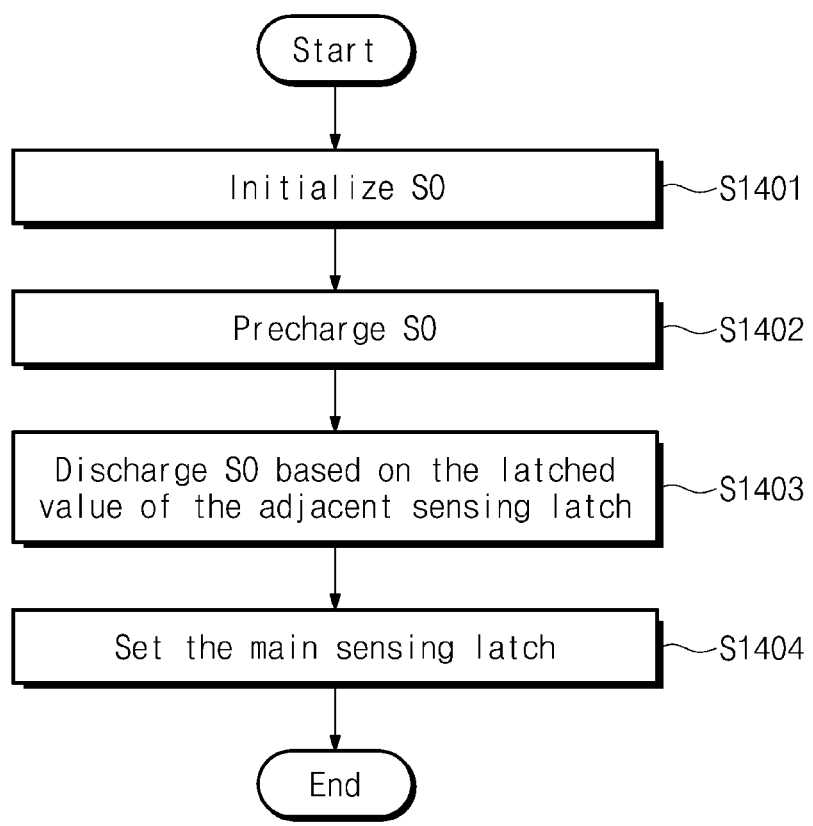
FIG. 14 illustrates operation S225 of FIG. 13 in detail according to example embodiments.

FIG. 14 illustrates operation S225 of FIG. 13 in detail according to example embodiments. Referring to FIGS. 1 to 4, 8B, 11, 13, and 14, operation S225 may include operation S1401 to operation S1404.

In operation S1401, the nonvolatile memory device 100 may initialize sensing nodes. For example, as in the manner in operation S1101 described above, the nonvolatile memory device 100 may perform operation S1401.

In operation S1402, the nonvolatile memory device 100 may precharge all the sensing nodes. For example, as in the manner in operation S1102 described above, the nonvolatile memory device 100 may perform operation S1402.

In operation S1403, the nonvolatile memory device 100 may discharge a part of the sensing nodes based on data stored in adjacent sensing latches. For example, as in the manner in operation S1103 described above, the nonvolatile memory device 100 may perform operation S1403.

In operation S1404, the nonvolatile memory device 100 may set the main sensing latches. For example, voltage levels of the sensing nodes may be respectively applied to the main sensing latches in response to the latch signal SLAT of the high level and the set signal SET_S of the high level. As such, main sensing latches connected to adjacent sensing latches in which a value corresponding to logic "1" is stored as an adjacent sensing result may maintain main sensing results latched before operation S1401 is performed. However, a value corresponding to logic "1" may again be latched at main sensing latches connected to adjacent sensing latches in which a value corresponding to logic "0" is stored as an adjacent sensing result.

Figure 15A:
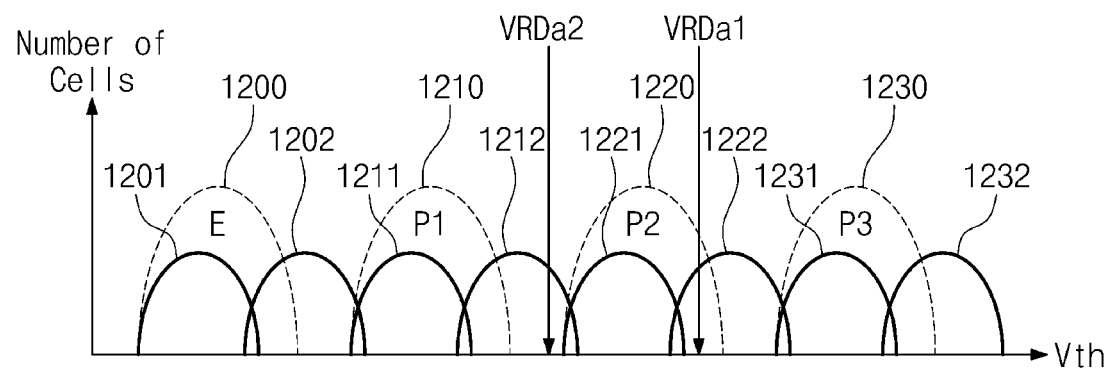
FIGS. 15A and 15B illustrate threshold voltage distributions of selected memory cells according to an embodiment of the present disclosure.
Figure 15B:
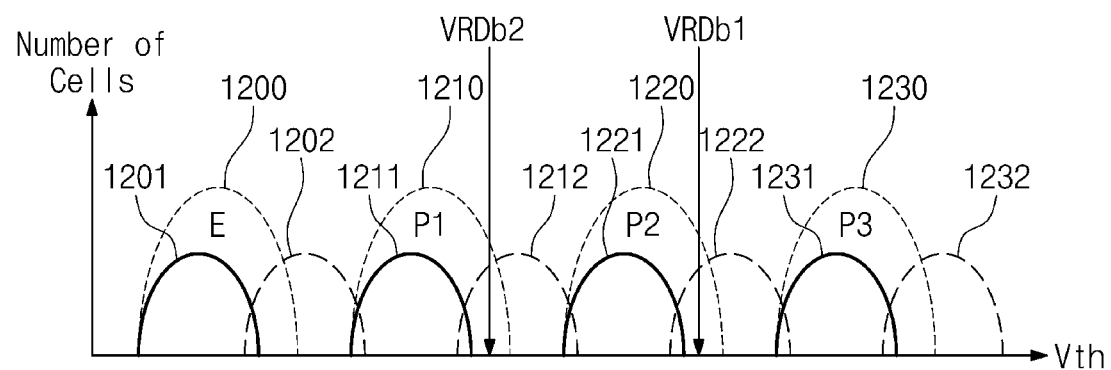

FIGS. 15A and 15B illustrate threshold voltage distributions of selected memory cells according to an embodiment of the present disclosure. Referring to FIGS. 1 to 3, 12, 15A, and 15B, FIGS. 15A and 15B show a part of threshold voltage distributions of selected memory cells after adjacent memory cells are programmed. In the embodiment illustrated in FIGS. 15A and 15B, when a voltage VRDa2 or VRDb2 is applied to a selected word line, memory cells having threshold voltages greater than the voltage VRDa2 from among memory cells belonging to the curve 1212 may be abnormally recognized as being programmed to the program state P2.

In an embodiment, the nonvolatile memory device 100 may perform first sensing by using voltages VRDa1 and VRDa2 and may perform second sensing by using voltages VRDb1 and VRDb2. For example, the nonvolatile memory device 100 may perform first coarse sensing by applying the voltage VRDa1 to the selected word line and may perform first main sensing by applying the voltage VRDa2 to the selected word line. The nonvolatile memory device 100 may perform second coarse sensing by applying the voltage VRDb1 to the selected word line and may perform second main sensing by applying the voltage VRDb2 to the selected word line.

In other words, unlike the embodiment illustrated in FIGS. 12 and 13, the first coarse sensing and the second coarse sensing may be further performed by using the voltages VRDa1 and VRDb1 in the embodiment illustrated in FIGS. 15A and 15B. As the first coarse sensing and the second coarse sensing are performed, the possibility that an error (or a noise) occurs when data are latched by main sensing latches may decrease.

For example, it is assumed that only the first main sensing is performed by using only the voltage VRDa2. In this case, it may be necessary to latch logic "1" at main sensing latches corresponding to memory cells having threshold voltages greater than the voltage VRDa2 substantially simultaneously. However, wrong logical values may be latched at main sensing latches due to the coupling between the page buffers PB0 to PBn−1 (i.e., an error or a noise may occur due to the coupling). In contrast, because the number of main sensing latches, in which logic "1" has to be latched substantially at the same time in the case where the first coarse sensing is performed by using the voltage VRDa1 greater than the voltage VRDa2, decreases, the degree of coupling may decrease. Accordingly, the possibility that wrong logical values are latched by main sensing latches may decrease. As a result, the reliability of the read operation of the nonvolatile memory device 100 may be improved.

Below, a read operation associated with FIGS. 15A and 15B will be more fully described with reference to FIG. 16.

Figure 16:
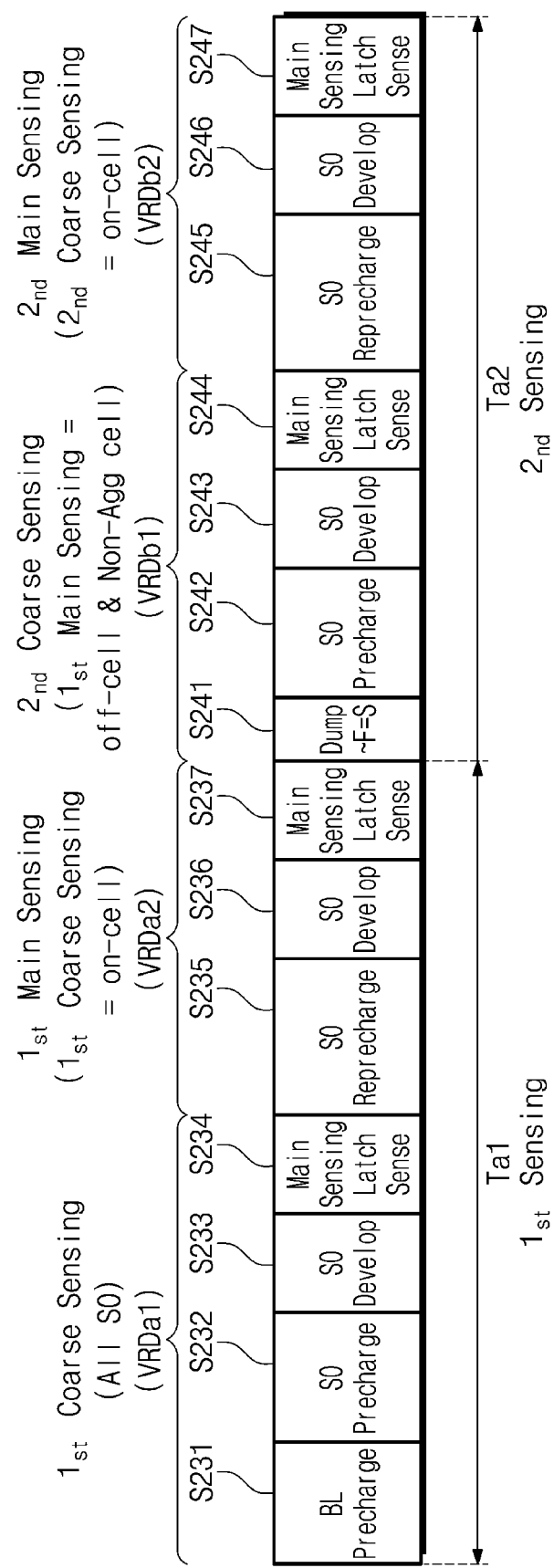
FIG. 16 illustrates operation S200 of FIG. 9 according to another embodiment of the present disclosure in detail.

FIG. 16 illustrates operation S200 of FIG. 9 according to another embodiment of the present disclosure in detail. Referring to FIGS. 1 to 3, 8B, 9, 12, 13, 15A, 15B, and 16, operation S200 may include operation S231 to operation S237 and operation S241 to operation S247. The nonvolatile memory device 100 may perform first sensing in an time interval Ta1 and may perform second sensing in an time interval Ta2. For example, the nonvolatile memory device 100 may perform the first coarse sensing, the first main sensing, the second coarse sensing, and the second main sensing by using four voltages (e.g., VRDa1, VRDa2, VRDb1, and VRDb2), each of which is applied to a selected word line. A level of a voltage that is applied to the selected word line may be adjusted by the control logic circuit 150.

For another example, the nonvolatile memory device 100 may perform the first coarse sensing and the first main sensing by adjusting a develop time of a sensing node in a state where the same voltage is applied to the selected word line during the first coarse sensing and the first main sensing. As in the above description, the nonvolatile memory device 100 may perform the second coarse sensing and the second main sensing by adjusting a develop time of a sensing node in a state where a voltage, which is different from the voltage applied to the selected word line during the first coarse sensing and the first main sensing, is applied to the selected word line. The develop time of the sensing node may be adjusted by the control logic circuit 150.

For another example, the nonvolatile memory device 100 may perform the first coarse sensing, the first main sensing, the second coarse sensing, and the second main sensing by adjusting a develop time of a sensing node in a state where the same voltage is applied to the selected word line during the first coarse sensing, the first main sensing, the second coarse sensing, and the second main sensing.

In an embodiment, the row decoder circuit 120 of the nonvolatile memory device 100 may apply a voltage (e.g., the voltage VRDa1) to the selected word line WLk in the time interval Ta1 and may apply a voltage (e.g., the voltage VRDb1) to the selected word line WLk in the time interval Ta2. A level of a voltage that is applied to the selected word line WLk from the row decoder circuit 120 may be adjusted by the control logic circuit 150.

In operation S231, the nonvolatile memory device 100 may precharge the bit lines BL. For example, the nonvolatile memory device 100 may perform operation S231 in a manner similar to the manner in operation S101 described above.

In operation S232, the nonvolatile memory device 100 may precharge all the sensing nodes. For example, the nonvolatile memory device 100 may perform operation S232 in a manner similar to the manner in operation S222 described above.

In operation S233, the nonvolatile memory device 100 may develop the sensing nodes. For example, the nonvolatile memory device 100 may perform operation S233 in a manner similar to the manner in operation S104 described above.

In operation S234, the nonvolatile memory device 100 may latch data stored in the selected memory cells at the main sensing latches. For example, the nonvolatile memory device 100 may perform operation S234 in a manner similar to the manner in operation S214 described above.

In operation S235, the nonvolatile memory device 100 may again selectively precharge a part of the sensing nodes. For example, the bias signal SLBS of the high level and the sensing node precharge signal SOPRE of the high level may be applied to the page buffers PB0 to PBn−1. As such, by the bias blocks (e.g., 351) of the main sensing latches, sensing nodes connected to main sensing latches, in which a main sensing result stored in operation S234 is logic "1", from among the sensing nodes may be discharged, and only sensing nodes connected to main sensing latches, in which a main sensing result stored in operation S234 is logic "0", may be precharged. For example, sensing nodes that correspond to memory cells determined as an on-cell as a result of the first coarse sensing (or sensing nodes of page buffers in which the first coarse sensing result is logic "0") may again be precharged.

In operation S236, the nonvolatile memory device 100 may develop the sensing nodes. For example, the nonvolatile memory device 100 may perform operation S236 in a manner similar to the manner in operation S104 described above. In this case, a length of a time when operation S236 is performed may be smaller than a length of a time when operation S233 is performed. Accordingly, substantially the same result as when a voltage (e.g., the voltage VRDa2) that is smaller than a voltage (e.g., the voltage VRDa1) actually applied to the selected word line WLk from the row decoder circuit 120 and is equal to or greater than threshold voltages of memory cells belonging to the curve 1221 is applied to the selected word line WLk from the row decoder circuit 120 may be achieved.

For another example, voltages of bit lines that are connected to memory cells having threshold voltages smaller than the voltage VRDa1 from among the memory cells belonging to the curve 1221 due to the first coarse sensing may already become smaller than the bit line precharge voltage VPRCG. The nonvolatile memory device 100 may adjust a length of a time, during which operation S236 is performed, such that a voltage of a sensing node corresponding to the voltage of the bit line already decreased does not decrease to the reference value or smaller. In this case, the nonvolatile memory device 100 may further adjust a length of a time, during which operation S236 is performed, such that voltages of sensing nodes corresponding to memory cells belonging to the curves 1201, 1202, and 1211 and memory cells having threshold voltages smaller than the voltage VRDa2 from among the memory cells belonging to the curve 1212 decrease to the reference value or smaller.

In operation S237, the nonvolatile memory device 100 may latch data stored in the selected memory cells at the main sensing latches. For example, the nonvolatile memory device 100 may perform operation S237 in a manner similar to the manner in operation S214 described above. Unlike operation S224 of FIG. 13, because the first coarse sensing is performed in operation S237 of FIG. 16, the number of main sensing latches in which logic "1" is latched (or the number of memory cells that are determined as an off-cell in operation S234 but are determined as an on-cell in operation S237) may further decrease. As such, a noise occurring in the main sensing latches may decrease.

In operation S241, the nonvolatile memory device 100 may dump data stored in the adjacent sensing latches to the main sensing latches. As such, the nonvolatile memory device 100 may set main sensing results "S" stored in main sensing latches corresponding to adjacent sensing latches, in which adjacent sensing results "F" are logic "0", to logic "1" ("~F=S"). For example, the nonvolatile memory device 100 may perform operation S241 in a manner similar to the manner in operation S225 described above.

In operation S242, the nonvolatile memory device 100 may again selectively precharge a part of the sensing nodes. For example, as in the manner in operation S226, the nonvolatile memory device 100 may invert main sensing results "S". Afterwards, the sensing node precharge signal SOPRE of the high level may be applied to the sensing node precharge blocks of the page buffers PB0 to PBn−1, and the bias signal SLBS of the high level may be applied to the bias blocks of the main sensing latches. As such, due to operation S241, sensing nodes, which correspond to memory cells sensed as an on-cell as a result of the first main sensing and memory cells corresponding to the second bit lines may be discharged. Only sensing nodes corresponding to memory cells sensed as an off-cell and sensing nodes corresponding to the first bit lines (or only sensing nodes of page buffers in which the first main sensing results correspond to logic "1" and page buffers in which adjacent sensing results correspond to logic "0") may again be precharged.

In operation S243, the nonvolatile memory device 100 may develop the sensing nodes. For example, the nonvolatile memory device 100 may perform operation S243 in a manner similar to the manner in operation S227 described above. Similarly to operation S227, the nonvolatile memory device 100 may reset the main sensing latches.

In operation S244, the nonvolatile memory device 100 may latch data stored in the selected memory cells at the main sensing latches. For example, the nonvolatile memory device 100 may perform operation S244 in a manner similar to the manner in operation S214 described above.

In operation S245, the nonvolatile memory device 100 may again selectively precharge a part of the sensing nodes. For example, the nonvolatile memory device 100 may perform operation S245 in a manner similar to the manner in operation S235 described above. As such, sensing nodes that correspond to memory cells sensed as an off-cell as a result of the second coarse sensing may be discharged, and sensing nodes that correspond to memory cells sensed as an on-cell as a result of the second coarse sensing (or sensing nodes of page buffers in which the second coarse sensing result is logic "0") may again be precharged.

In operation S246, the nonvolatile memory device 100 may develop the sensing nodes. For example, the nonvolatile memory device 100 may perform operation S246 in a manner similar to the manner in operation S104 described above. In this case, a length of a time when operation S246 is performed may be smaller than a length of a time when operation S243 is performed.

In operation S247, the nonvolatile memory device 100 may latch data stored in the selected memory cells at the main sensing latches. For example, the nonvolatile memory device 100 may perform operation S247 in a manner similar to the manner in operation S214 described above.

FIG. 17 illustrates a block diagram of a storage device including a nonvolatile memory device of FIG. 1. Referring to FIGS. 1 and 17, a storage device 1 may include the memory controller 10, an external buffer 20, and the nonvolatile memory device 100 of FIG. 1.

The memory controller 10 may receive various requests for writing data in the nonvolatile memory device 100 or reading data from the nonvolatile memory device 100 from an external host device. The memory controller 10 may store data received from or to be transmitted to the external host device and data for managing the storage device 1 in the external buffer 20.

The memory controller 10 may include a host interface 11, a processor 12, a memory manager 13, an internal buffer 14, a buffer controller 15, an error correction code (ECC) block 16, and a bus 17.

The host interface 11 may receive various requests from the external host device. For example, the host interface 11 may decode a request received from the external host device. The host interface 11 may store a result of decoding the request in the internal buffer 14. The host interface 11 may transmit a data signal to the external host device in response to a request received from the external host device.

The processor 12 may drive an operating system or firmware for driving the memory controller 10. The processor 12 may read the decoding result stored in the internal buffer 14. The processor 12 may generate a command(s) and an address(es) based on the read decoding result for the purpose of controlling the nonvolatile memory device 100. The processor 12 may transfer the generated command(s) and address(es) to the memory manager 13. Under control of the processor 12, data stored in the internal buffer 14 and the external buffer 20 may be stored in the nonvolatile memory device 100 by the memory manager 13.

The memory manager 13 may communicate with the nonvolatile memory device 100 under control of the processor 12. For example, the memory manager 13 may transmit a command and an address generated by the processor 12, data stored in the internal buffer 14, and data stored in the external buffer 20 to the nonvolatile memory device 100 through a channel CH. The memory manager 13 may receive data stored in the nonvolatile memory device 100 through the channel CH.

The internal buffer 14 may include a random access memory (RAM). For example, the internal buffer 14 may include a static RAM (SRAM) or a dynamic RAM (DRAM). Under control of the processor 12, the buffer controller 15 may write data in the external buffer 20 or may read data from the external buffer 20.

The ECC block 16 may perform error correction encoding on data to be transmitted to the nonvolatile memory device 100 by using an error correction code ECC. The ECC block 16 may perform error correction decoding on data received from the nonvolatile memory device 100 by using the error correction code ECC.

The external buffer 20 may include a random access memory (RAM). For example, the external buffer 20 may include a DRAM, a phase change RAM (PRAM), a magnetic RAM (MRAM), a resistive RAM (RRAM), or the like.

In an embodiment, the nonvolatile memory device 100 may receive, from the memory controller 10, a command CMD directing whether to perform a read operation on data stored in selected memory cells connected to a word line (e.g., WLk: k being a natural number smaller than m) selected from word lines. In this case, the command CMD may direct to perform a normal read operation or may direct a data recovery read operation. For example, the command CMD may include a descriptor indicating a read operation to be performed by the nonvolatile memory device 100.

When the command CMD indicating the normal read operation is received from the memory controller 10, during the normal read operation, the control logic circuit 150 may allow the row decoder circuit 120 to activate the selected word line and may allow the page buffer circuit 130 to sense data stored in selected memory cells connected to the selected word line through a plurality of bit lines.

When the command CMD indicating the data recovery read operation is received from the memory controller 10, during the read operation, the control logic circuit 150 may first allow the row decoder circuit 120 to activate an adjacent word line adjacent to the selected word line and may then allow the row decoder circuit 120 to activate the selected word line. When the adjacent word line is activated by the row decoder circuit 120, the control logic circuit 150 may allow the page buffer circuit 130 to sense data stored in adjacent memory cells. When the selected word line is activated by the row decoder circuit 120, the control logic circuit 150 may allow the page buffer circuit 130 to sense data stored in selected memory cells, based on a result of sensing the adjacent memory cells.

In another embodiment, the control logic circuit 150 may adjust the number of groups into which adjacent memory cells are capable of being classified and a level of a voltage to be used to classify the adjacent memory cells, based on the command CMD received from the memory controller 10.

In another embodiment, the control logic circuit 150 may adjust a length of each of the time intervals T11, T21, and T31, based on the command CMD received from the memory controller 10. For example, the length of each of the time intervals T11, T21, and T31 may be adjusted based on various factors such as the number of bits of data capable of being stored in one memory cell, a state to which each memory cell is programmed, an expected life (e.g., the number of program/erase cycles) of the nonvolatile memory device 100, and a temperature of the nonvolatile memory device 100. For another example, the length of each of the time intervals T11, T21, and T31 may be adjusted whether a memory cell including memory cells targeted for a read request corresponds to any of the memory blocks BLK1 to BLKz.

In another embodiment, the control logic circuit 150 may adjust a level of a voltage to be applied to the selected word line WLk by the row decoder circuit 120 in the time interval Tj1 of FIG. 13 and the time intervals Ta1 and Ta2 of FIG. 16, based on the command CMD. The control logic circuit 150 may adjust lengths of sensing node develop times in operation S213 and operation S217 of FIG. 10, operation S223 and operation S227 of FIG. 13, and operation S233, operation S236, operation S243, and operation S246 of FIG. 16, based on the command CMD. For example, by using a manner similar to the manner to adjust lengths of the time intervals T11, T21, and T31, the control logic circuit 150 may adjust the voltage levels and the lengths of sensing node develop times described above in consideration of various factors.

Figure 18:
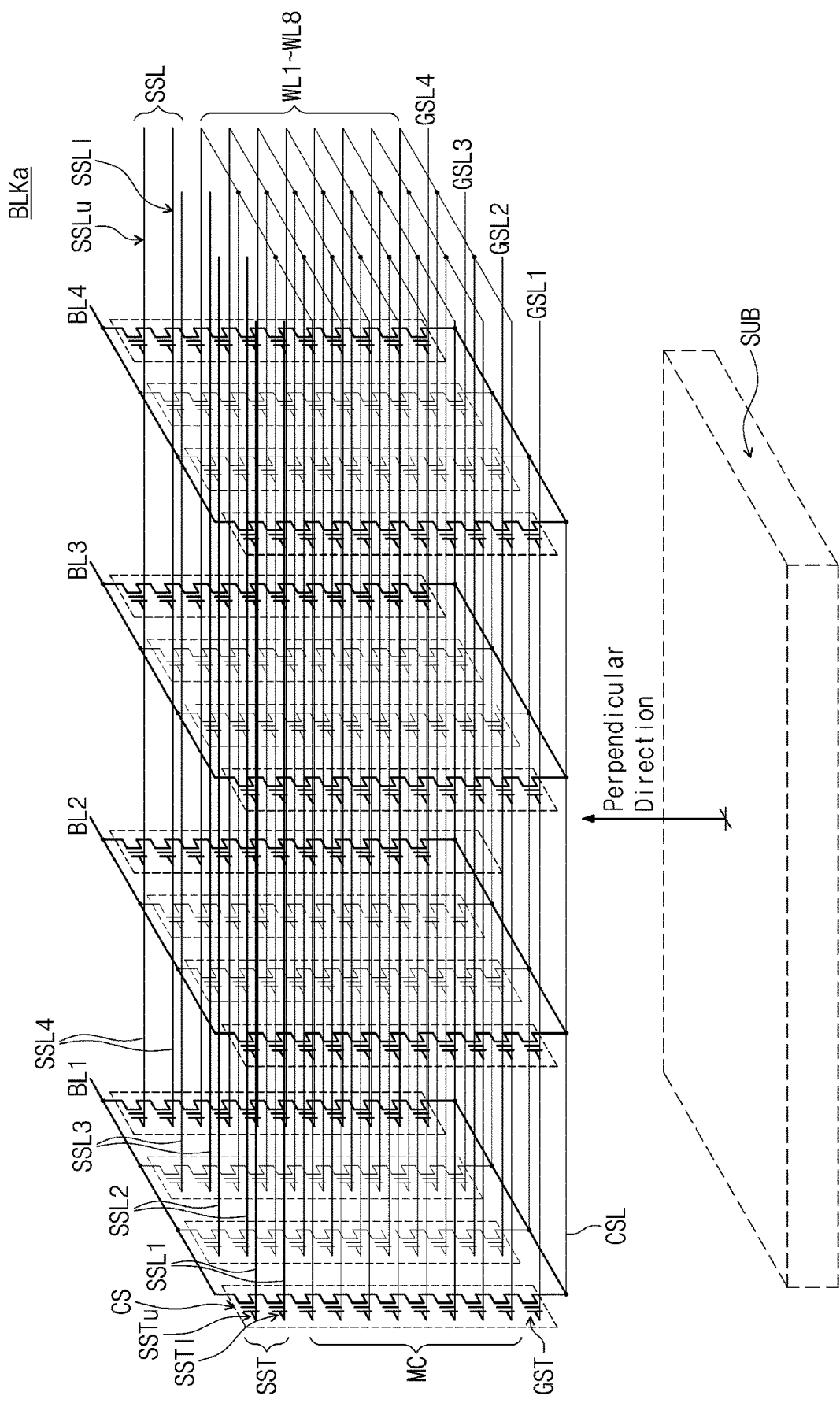
FIG. 18 illustrates a nonvolatile memory device according to another embodiment of the present disclosure.

FIG. 18 illustrates a nonvolatile memory device according to another embodiment of the present disclosure. FIG. 18 shows a memory block BLKa of the memory blocks BLK1 to BLKz of FIG. 1. In the embodiment illustrated in FIG. 18, a plurality of cell strings CS may be arranged on a substrate SUB in rows and columns. The plurality of cell strings CS may be connected in common to the common source line CSL formed on (or in) a substrate SUB. A location of the substrate SUB is not limited to the embodiment illustrated in FIG. 18.

In the embodiment illustrated in FIG. 18, the common source line CSL may be connected to lower ends of the cell strings CS. However, it is sufficient if the common source line CSL is electrically connected to the lower ends of the cell strings CS. Accordingly, the present disclosure is not limited to the embodiment in which the common source line CSL is physically located at the lower ends of the cell strings CS. Also, in the embodiment illustrated in FIG. 18, the cell strings CS are arranged in a 4×4 matrix, but the number of cell strings CS included in the block BLKa may increase or decrease.

Cell strings of each row may be connected in common to the ground selection line GSL and may be connected to a relevant string selection line of string selection lines SSL1 to SSL4. Cell strings of each column may be connected to a relevant bit line of bit lines BL1 to BL4.

Each of the cell strings CS may include at least one ground selection transistor GST connected to the ground selection line GSL, a plurality of memory cells MC respectively connected to a plurality of word lines WL1 to WL8, and string selection transistors SST (including SST1 and SSTu) respectively connected to relevant string selection lines of the string selection lines SSL1 to SSL4.

In each of the cell strings CS, the ground selection transistor GST, the memory cells MC, and the string selection transistors SST may be connected in series in a direction perpendicular to the substrate SUB and may be sequentially stacked in the direction perpendicular to the substrate SUB. In each of the cell strings CS, at least one of the memory cells MC may be used as a dummy memory cell. The dummy memory cell may not be programmed (e.g., may be program-inhibited) or may be programmed differently from the remaining memory cells other than the dummy memory cell from among the memory cells MC1 to MC8.

Figure 19:
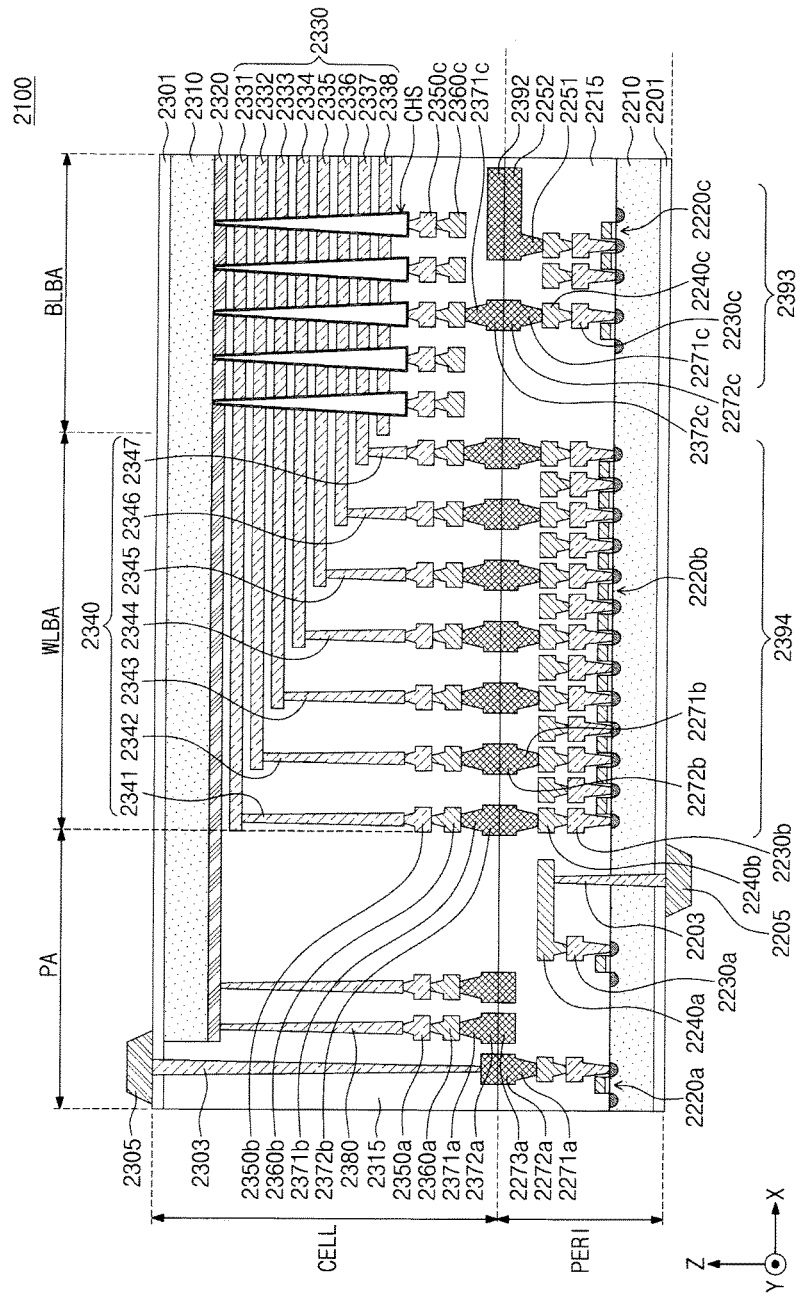
FIG. 19 illustrates a cross-sectional view of a nonvolatile memory device according to another embodiment of the present disclosure.

FIG. 19 illustrates a cross-sectional view of a nonvolatile memory device according to another embodiment of the present disclosure. Referring to FIG. 19, a nonvolatile memory device 2100 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner may be a Cu—Cu bonding, and the bonding metals may also be formed of aluminum or tungsten.

Each of the peripheral circuit region PERI and the cell region CELL of the nonvolatile memory device 2100 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an embodiment, the first metal layers 2230a, 2230b, and 2230c may be formed of tungsten having a relatively high resistance, and the second metal layers 2240a, 2240b, and 2240c may be formed of copper having a relatively low resistance.

In an embodiment illustrate in FIG. 19, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and may cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

Also, the upper bonding metals 2371b and 2372b in the cell region CELL may be referred as first metal pads, and the lower bonding metals 2271b and 2272b in the peripheral circuit region PERI may be referred as second metal pads. The first metal pad and the second metal pad may be directly connected through the above bonding manner.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (i.e., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

In the bit line bonding area BLBA, a channel structure CHS may extend in a direction perpendicular to the upper surface of the second substrate 2310 and may pass through the plurality of word lines 2330, the string selection lines, and the ground selection line. The channel structure CHS may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an embodiment, the bit line 2360c may extend in a first direction (i.e., a Y-axis direction) parallel to the upper surface of the second substrate 2310.

In an embodiment illustrated in FIG. 19, an area in which the channel structure CHS, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (i.e., an X-axis direction) parallel to the upper surface of the second substrate 2310 and may be connected to a plurality of cell contact plugs 2341 to 2347 (i.e., 2340). The word lines 2330 and the cell contact plugs 2340 may be connected to each other at pads provided by at least some of the plurality of word lines 2330, which extend in the second direction with different lengths. A first metal layer 2350b and a second metal layer 2360b may be sequentially connected to an upper portion of each of the cell contact plugs 2340 connected to the word lines 2330. The cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected to the circuit elements 2220b providing a row decoder 2394 in the peripheral circuit region PERI. In an embodiment, operating voltages of the circuit elements 2220b providing the row decoder 2394 may be different from operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected to the common source line 2320. A first metal layer 2350a and a second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Meanwhile, input/output pads 2205 and 2305 may be disposed in the external pad bonding area PA. Referring to FIG. 19, a lower insulating film 2201 covering a lower surface of the first substrate 2210 may be formed below the first substrate 2210, and the first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 19, an upper insulating film 2301 covering the upper surface of the second substrate 2310 may be formed on the second substrate 2310, and the second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303 and the lower bonding metals 2271a and 2271b of the peripheral circuit region PERI.

According to embodiments, the second substrate 2310 and the common source line 2320 may not be disposed in an area in which the second input/output contact plug 2303 is disposed. Also, the second input/output pad 2305 may not overlap the word lines 2330 in the third direction (i.e., the Z-axis direction). Referring to FIG. 19, the second input/output contact plug 2303 may be separated from the second substrate 2310 in a direction parallel to the upper surface of the second substrate 2310 and may pass through an inter-layer insulating layer 2315 of the cell region CELL to be connected to the second input/output pad 2305 and the lower bonding metals 2271a and 2272a of the peripheral circuit region PERI.

According to embodiments, the first input/output pad 2205 and the second input/output pad 2305 may be selectively formed. For example, the nonvolatile memory device 2100 may include only the first input/output pad 2205 disposed on the first substrate 2210 or the second input/output pad 2305 disposed on the second substrate 2310. Alternatively, the nonvolatile memory device 2100 may include both the first input/output pad 2205 and the second input/output pad 2305.

A metal pattern in an uppermost metal layer may be provided as a dummy pattern or the uppermost metal layer may be absent, in each of the external pad bonding area PA and the bit line bonding area BLBA respectively included in the cell region CELL and the peripheral circuit region PERI.

In the external pad bonding area PA, the nonvolatile memory device 2100 may include a lower metal pattern 2273a, which corresponds to an upper metal pattern 2372a formed in an uppermost metal layer of the cell region CELL and has the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. As in the above description, in the external pad bonding area PA, an upper metal pattern which corresponds to the lower metal pattern formed in an uppermost metal layer of the peripheral circuit region PERI and has the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Also, the bit line bonding area BLBA, an upper metal pattern 2392, which corresponds to a lower metal pattern 2252 formed in the uppermost metal layer of the peripheral circuit region PERI and has the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, the nonvolatile memory device 2100, such as described in FIG. 19, can operate and can include device components according to one or more of the example embodiments described in FIGS. 1 to 4, 5A, 5B, 6, 7A, 7B, 8A, 8B, 9 to 14, 15A, 15B, and 16 to 18, previously. In an example embodiment, the cell region CELL may correspond to a portion of the memory cell array 110 of FIG. 1. In an example embodiment, the peripheral circuit region PERI may correspond to a portion of at least one of the row decoder circuit 120, the page buffer circuit 130, the data input/output circuit 140, and the control logic circuit 150 of FIG. 1. For example, the page buffer 2393 of FIG. 19 may correspond to the page buffer circuit 130 of FIG. 1, and the row decoder 2394 of FIG. 19 may correspond to the row decoder circuit 120 of FIG. 1.

According to an embodiment of the present disclosure, a nonvolatile memory device may perform sensing on adjacent memory cells and may perform sensing on selected memory cells based on a result of sensing the adjacent memory cells. When the sensing is performed on the selected memory cells, a result of sensing the selected memory cells may be latched at one latch at least two times. Accordingly, a nonvolatile memory device with improved reliability and the less area and an operating method of the nonvolatile memory device may be provided.

While the present disclosure has been described with reference to some embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
a memory cell array including memory cells arranged in rows and columns;
a row decoder circuit connected to the rows of the memory cells through word lines, the row decoder circuit configured to select a first word line of the word lines connected to adjacent memory cells adjacent to selected memory cells and a second word line of the word lines connected to the selected memory cells; and
a page buffer circuit connected to the columns of the memory cells through bit lines and including first latches and second latches,
wherein the page buffer circuit is configured to:
respectively latch first sensing values, which are based on data stored in the adjacent memory cells, at the first latches; and
respectively latch second sensing values, which are based on data stored in the selected memory cells, at the second latches at least two times,
wherein the page buffer circuit further includes sensing nodes electrically connected to the bit lines, the first latches, and the second latches, and
wherein the page buffer circuit is configured to, when the second word line is selected by the row decoder circuit;
precharge sensing nodes of a first group from among the sensing nodes based on the first sensing values respectively latched at the first latches;
after a first time interval from a time when the sensing nodes of the first group are precharged, latch the second sensing values at the second latches based on voltage levels of the sensing nodes;
precharge sensing nodes of a second group from among the sensing nodes based on the first sensing values respectively latched at the first latches; and
after a second time interval from a time when the sensing nodes of the second group are precharged, again latch the second sensing values at the second latches based on voltage levels of the sensing nodes.

2. The nonvolatile memory device of claim 1, wherein the nonvolatile memory device is configured such that, when the sensing nodes of the first group are precharged, all the bit lines are precharged.

3. The nonvolatile memory device of claim 1, wherein the first time interval is smaller than the second time interval.

4. The nonvolatile memory device of claim 1, wherein the sensing nodes of the first group correspond to a first set of the first latches, in which a first logical value is latched as a corresponding one of the first sensing values, from among the first latches, and
wherein the sensing nodes of the second group correspond to a second set of the first latches, in which a second logical value different from the first logical value is latched as a corresponding one of the first sensing values, from among the first latches.

5. The nonvolatile memory device of claim 1, wherein the page buffer circuit is configured to, in response to one read command received from an external device, respectively latch the first sensing values at the first latches and latches the second sensing values at the second latches at least two times.

6. A nonvolatile memory device comprising:
a memory cell array including memory cells arranged in rows and columns;
a row decoder circuit connected to the rows of the memory cells through word lines, the row decoder circuit configured to select a first word line of the word lines connected to adjacent memory cells adjacent to selected memory cells and a second word line of the word lines connected to the selected memory cells; and
a page buffer circuit connected to the columns of the memory cells through bit lines and including first latches and second latches,
wherein the page buffer circuit is configured to:
respectively latch first sensing values, which are based on data stored in the adjacent memory cells, at the first latches; and
respectively latch second sensing values, which are based on data stored in the selected memory cells, at the second latches at least two times,
wherein the page buffer circuit further includes sensing nodes respectively electrically connected to the bit lines, and
wherein the page buffer circuit is configured to, when the second word line is selected by the row decoder circuit:
precharge the sensing nodes;
after a first time interval from a time when the sensing nodes are precharged, latch the second sensing values at the second latches based on changes in voltage levels of the sensing nodes;
precharge sensing nodes of a first group from among the sensing nodes based on the second sensing values respectively latched at the second latches; and
after a second time interval from a time when the sensing nodes of the first group are precharged, again latch the second sensing values at the second latches during the second time interval based on changes in voltage levels of the sensing nodes.

7. The nonvolatile memory device of claim 6, wherein the first time interval is greater than the second time interval.

8. The nonvolatile memory device of claim 6, wherein the page buffer circuit is configured to, after the second sensing values are latched at the second latches after the first time interval from a time when all the sensing nodes are precharged, precharge the sensing nodes of the first group further based on the first sensing values respectively latched at the first latches.

9. The nonvolatile memory device of claim 6, wherein the page buffer circuit is configured to, after again latching the second sensing values at the second latches after the second time interval from the time when the sensing nodes of the first group are precharged:
again precharge sensing nodes of a second group from among the sensing nodes based on the first sensing values latched at the first latches and the second sensing values currently latched at the second latches;

after a third time interval from the time when the sensing nodes of the second group are precharged, latch the second sensing values at the second latches based on changes in voltage levels of the sensing nodes;

again precharge sensing nodes of a third group from among the sensing nodes based on the second sensing values respectively latched at the second latches; and after a fourth time interval from the time when the sensing nodes of the third group are precharged, latch the second sensing values at the second latches based on changes in voltage levels of the sensing nodes.

10. A nonvolatile memory device comprising:

a memory cell region including a first metal pad and a memory cell array; and a peripheral circuit region including a second metal pad and vertically connected to the memory cell region by the first metal pad and the second metal pad, wherein the memory cell array includes a plurality of cell strings each including a plurality of memory cells, a plurality of word lines connected to the plurality of memory cells, a plurality of bit lines connected to the plurality of cell strings, and a ground selection line connected to the plurality of cell strings, wherein the peripheral circuit region includes:

a row decoder circuit configured to select a first word line connected to adjacent memory cells adjacent to selected memory cells of the plurality of memory cells and a second word line connected to the selected memory cells from the word lines; and a page buffer circuit connected to the bit lines and including first latches and second latches, wherein the page buffer circuit is configured to:

respectively latch first sensing values, which are based on data stored in the adjacent memory cells, at the first latches; and respectively latch second sensing values, which are based on data stored in the selected memory cells, at the second latches at least two times.

11. The nonvolatile memory device of claim 10, wherein the page buffer circuit further includes sensing nodes electrically connected to the bit lines, the first latches, and the second latches, wherein the page buffer circuit is configured to, when the second word line is selected by the row decoder circuit:

precharge sensing nodes of a first group from among the sensing nodes based on the first sensing values respectively latched at the first latches;

after a first time interval from a time when the sensing nodes of the first group are precharged, latch the second sensing values at the second latches based on voltage levels of the sensing nodes;

precharge sensing nodes of a second group from among the sensing nodes based on the first sensing values respectively latched at the first latches; and after a second time interval from a time when the sensing nodes of the second group are precharged, again latch the second sensing values at the second latches based on voltage levels of the sensing nodes.

12. The nonvolatile memory device of claim 11, wherein the first time interval is smaller than the second time interval.

* * * * *